US008854875B1

(12) United States Patent
Willey et al.

(10) Patent No.: US 8,854,875 B1
(45) Date of Patent: Oct. 7, 2014

(54) PHASE CHANGE MEMORY WITH FLEXIBLE TIME-BASED CELL DECODING

(71) Applicant: Being Advanced Memory Corporation, Williston, VT (US)

(72) Inventors: Aaron D. Willey, Burlington, VT (US); Ryan Jurasek, Burlington, VT (US)

(*) Notice: Subject to any disclaimer, the term of this patent is extended or adjusted under 35 U.S.C. 154(b) by 0 days.

(21) Appl. No.: 14/242,454

(22) Filed: Apr. 1, 2014

Related U.S. Application Data

(63) Continuation of application No. 14/011,423, filed on Aug. 27, 2013, now Pat. No. 8,830,741.

(60) Provisional application No. 61/816,045, filed on Apr. 25, 2013.

(51) Int. Cl.
*G11C 11/00* (2006.01)
*G11C 13/00* (2006.01)

(52) U.S. Cl.
CPC .......... *G11C 13/0004* (2013.01); *G11C 13/004* (2013.01)
USPC .......................................... 365/163; 365/148

(58) Field of Classification Search
USPC ................................... 365/163, 148
See application file for complete search history.

(56) References Cited

U.S. PATENT DOCUMENTS

| 2007/0255891 | A1 | 11/2007 | Chow et al. | |
|---|---|---|---|---|
| 2009/0067227 | A1 | 3/2009 | Kang et al. | |
| 2011/0149628 | A1 | 6/2011 | Langtry et al. | |
| 2012/0140554 | A1 | 6/2012 | Kim et al. | |
| 2013/0163321 | A1* | 6/2013 | Lam et al. | 365/163 |

FOREIGN PATENT DOCUMENTS

KR 20100122368 A 11/2010

OTHER PUBLICATIONS

KIPO International Search Report for PCT/US2013/056862, mailed on Jan. 16, 2014.
KIPO Written Opinion for PCT/US2013/056862, mailed on Jan. 16, 2014.

* cited by examiner

*Primary Examiner* — Huan Hoang
(74) *Attorney, Agent, or Firm* — Gwendolyn S. S. Groover; Robert O. Groover, III; Seth A. Horwitz

(57) ABSTRACT

Methods and systems for time-based cell decoding for PCM memory. Generally, the higher the PCM element resistance, the longer it takes for a read output to change state. PCM memory output is determined using differentiated timings of read outputs changing state, rather than differentiated values of read outputs. In some single-bit single-ended sensing embodiments, a reference, with resistance between the resistances corresponding to a pair of adjacent logical states, is stored in multiple reference cells; a "vote" unit emits a clock signal when a majority of the reference cell read outputs transition at the vote unit. Timing units produce different binary outputs depending on whether a data read output or the clock signal changes state first at the timing unit. Time-based decoding provides advantages including improved temperature and drift resilience, improved state discrimination, improved reliability of multibit PCM, and fast and reliable sensing.

20 Claims, 20 Drawing Sheets

PHASE CHANGE MEMORY WITH FLEXIBLE TIME-BASED CELL DECODING

CROSS-REFERENCE

Priority is claimed from Provisional Patent Application No. 61/816,045, which is hereby incorporated by reference.

The following four applications, including the present application, share a common assignee, all have a common effective filing date (and are therefore co-pending), and share at least some overlapping inventorship. All of these applications, and all of their direct and indirect parent applications, are hereby incorporated by reference: U.S. application Ser. No. 14/011,327; U.S. application Ser. No. 14/011,306; U.S. application Ser. No. 14/011,423; U.S. application Ser. No. 14/011,266. Applicant reserves the right to claim priority back to all of these, in the US and/or in any other country where such priority can legally be claimed.

BACKGROUND

The present application relates to systems, devices and methods for memory access operations involving phase change memory units.

Note that the points discussed below may reflect the hindsight gained from the disclosed inventions, and are not necessarily admitted to be prior art.

Phase change memory ("PCM") is a relatively new nonvolatile memory technology, which is very different from any other kind of nonvolatile memory. First, the fundamental principles of operation, at the smallest scale, are different: no other kind of solid-state memory uses a reversible PHYSICAL change to store data. Second, in order to achieve that permanent physical change, an array of PCM cells has to allow read, set, and reset operations which are all very different from each other. The electrical requirements of the read, set, and reset operations make the peripheral circuit operations of a PCM very different from those of other nonvolatile memories. Obviously some functions, such address decoding and bus interface, can be the same, but the closest-in parts of the periphery, which perform set, reset, and read operations on an array or subarray, must satisfy some unique requirements.

The physical state of a PCM cell's memory material is detected as resistance. For each selected cell, its bitline is set to a known voltage, and the cell's access transistor is turned on (by the appropriate wordline). If the cell is in its low-resistance state, it will sink a significant current from the bit line; otherwise, it will not.

Set and Reset operations are more complicated. Both involve heat. As discussed below, a "set" operation induces the memory material to recrystallize into its low-resistance (polycrystalline) state, while a "reset" operation anneals the memory material into its high-resistance (amorphous) state.

Write operations (Set and Reset) normally have more time budget than read operations. In read mode a commercial PCM memory should be competitive with the access speed (and latency if possible) of a standard DRAM. If this degree of read speed can be achieved, PCM becomes very attractive for many applications.

The phase change material is typically a chalcogenide glass, using amorphous and crystalline (or polycrystalline) phase states to represent bit states.

A complete PCM cell can include, for example: a top electrode (connected to the bit line), a phase change material (e.g. a chalcogenide glass), a conductive pillar which reaches down from the bottom of the phase change material, an access transistor (gated by a word line), and a bottom connection to ground. The phase change material can extend over multiple cells (or over the whole array), but the access transistors are laterally isolated from each other by a dielectric.

FIG. 2A shows an example of a PCM element 2010. A top electrode 2020 overlies a phase change material 2030, e.g. a chalcogenide glass. Note that material 2030 also includes a mushroom-shaped annealed zone (portion) 2070 within it. (The annealed zone 2070 may or may not be present, depending on what data has been stored in this particular location.) The annealed zone 2070, if present, has a much higher resistivity than the other (crystalline or polycrystalline) parts of the material 2030.

A conductive pillar 2050 connects the material 2030 to a bottom electrode 2040. In this example, no selection device is shown, though in practice, an access transistor would normally be connected in series with the phase change material. The pillar 2050 is embedded in an insulator layer 2060.

When voltage is applied between the top 2020 and bottom 2040 electrodes, the voltage drop will appear across the high-resistivity zone 2070 (if present). If sufficient voltage is applied, breakdown will occur across the high-resistivity zone. In this state the material will become very conductive, with large populations of mobile carriers. The material will therefore pass current, and current crowding can occur near the top of the pillar 2050. The voltage which initiates this conduction is referred to as the "snapback" voltage, and FIG. 2C shows why.

FIG. 2C shows an example of instantaneous I-V curves for a device like that of FIG. 2A, in two different states. Three zones of operation are marked.

In the zone 2200 marked "READ," the device will act either as a resistor or as an open (perhaps with some leakage). A small applied voltage will result in a state-dependent difference in current, which can be detected.

However, the curve with open circles, corresponding to the amorphous state of the device, shows some more complex behaviors. The two curves show behaviors under conditions of higher voltage and higher current.

If the voltage reaches the threshold voltage $V_{th}$, current increases dramatically without any increase in voltage. (This occurs when breakdown occurs, so the phase-change material suddenly has a large population of mobile carriers.) Further increases in applied voltage above $V_{th}$ result in further increases in current; note that this upper branch of the curve with hollow circles shows a lower resistance than the curve with solid squares.

If the applied voltage is stepped up to reach the zone 2150, the behavior of the cell is now independent of its previous state.

When relatively large currents are applied, localized heating will occur at the top of the pillar 2050, due to the relatively high current density. Current densities with typical dimensions can be in the range of tens of millions of Amperes per square cm. This is enough to produce significant localized heating within the phase-change material.

This localized heating is used to change the state of the phase-change material, as shown in FIG. 2B. If maximum current is applied in a very brief pulse 2100 and then abruptly stopped, the material will tend to quench into an amorphous high-resistivity condition; if the phase-change material is cooled more gradually and/or not heated as high as zone 2150, the material can recrystallize into a low-resistivity condition. Conversion to the high-resistance state is normally referred to as "Reset", and conversion to the low-resistance state is normally referred to as "Set" (operation 2080). Note that, in this example, the Set pulse has a tail where current is reduced fairly gradually, but the Reset pulse does not. The duration of the Set pulse is also much longer than that of the Reset pulse, e.g. tens of microseconds versus hundreds of nanoseconds.

FIG. 2D shows an example of temperature versus resistivity for various PCM materials. It can be seen that each curve has a notable resistivity drop 2210 at some particular temperature. These resistivity drops correspond to phase change to a crystalline (or polysilicon) state. If the material is cooled gradually, it remains in the low resistivity state after cooling.

In a single-bit PCM, as described above, only two phases are distinguished: either the cell does or does not have a significant high-resistivity "mushroom cap" 2070. However, it is also possible to distinguish between different states of the mushroom cap 2070, and thereby store more than one bit per cell.

FIG. 2E shows an equivalent circuit for an "upside down" PCM cell 2010. In this example the pass transistor 2240 is gated by Wordline 2230, and is connected between the phase-change material 2250 and the bitline 2220. (Instead, it is somewhat preferable to connect this transistor between ground and the phase-change material.

FIG. 2F shows another example of a PCM cell 2010. A bitline 2220 is connected to the top electrode 2020 of the phase-change material 2250, and transistor 2240 which is connected to the bottom electrode 2030 of the PCM element. (The wordline 2230 which gates the vertical transistor 2240 is not shown in this drawing.) Lines 2232, which are shown as separate (and would be in a diode array), may instead be a continuous sheet, and provide the ground connection.

FIG. 2G shows an example of resistance (R) over time (t) for a single PCM cell following a single PCM write event at time t=0. The resistance curve 2400 for a cell which has been reset (i.e. which is in its high-resistance state) may rise at first, but then drifts significantly lower. The resistance curve 2410 for a cell in the Set state is much flatter. The sense margin 2420, i.e., the difference between set and reset resistances, also decreases over time. Larger sense margins generally result in more reliable reads, and a sense margin which is too small may not permit reliable reading at all. 2G represents the approximate behavior of one known PCM material; other PCM material compositions may behave differently. For example, other PCM material compositions may display variation of the set resistance over time.

The downwards drift of reset resistance may be due to, for example, shrinking size of the amorphous zone of the phase-change material, due to crystal growth; and, in some cells, spontaneous nucleation steepening the drift curve (possibly only slightly) due to introducing further conductive elements into the mushroom-shaped programmable region.

FIG. 2H shows an example of a processing system 2300. Typically, a processing system 2300 will incorporate at least some of interconnected power supplies 2310, processor units 2320 performing processing functions, memory units 2330 supplying stored data and instructions, and I/O units 2340 controlling communications internally and with external devices 2350.

FIG. 2I shows an example of a PCM single-ended sensing memory. Two different PCM cells 2400 on different ends of a sense amplifier can be selected separately. Selected elements 2410 are separately sensed by a single-ended sense amplifier 2420.

FIG. 2J shows an example of a known PCM single-ended sense amplifier 2500. Generally, in a single-ended sense amplifier, a cell read output conducted by a selected bitline BLB is compared against a reference current to provide a digital output OUT. When the PRECHARGE signal turns on transistor 2530, voltage V04 (e.g., 400 mV) precharges the bitline BLB. After precharge ends, the READ signal turns on transistor 2550. Transistor 2550 is connected, through source follower 2560 and load 2580, to provide a voltage which comparator 2600 compares to Voltage_REF, to thereby generate the digital output OUT.

A variety of nonvolatile memory technologies have been proposed over recent decades, and many of them have required some engineering to provide reference values for sensing. However, the requirements and constraints of phase-change memory are fundamentally different from those of any other kind of nonvolatile memory. Many memory technologies (such as EEPROM, EPROM, MNOS, and flash) test the threshold voltage of the transistor in a selected cell, so referencing must allow for the transistor's behavior. By contrast, phase-change memory simply senses the resistance of the selected cell. This avoids the complexities of providing a reference which will distinguish two (or more) possibilities for an active device's state, but does require detecting a resistance value, and tracking external variations (e.g. temperature and supply voltage) which may affect the instantaneous value of that resistance.

The possibility of storing more than one bit of data in a single phase-change material has also been suggested. Phase-change memories implementing such architectures are referred to here as "multibit" PCMs. If the "Set" and/or "Reset" operations can be controlled to produce multiple electrically distinguishable states, then more than one bit of information can be stored in each phase-change material location. It is known that the current over time profile of the Set operation can be controlled to produce electrically distinguishable results, though this can be due to more than one effect. In the simplest implementation, shorter anneals—too short to produce full annealing of the amorphous layer—can be used to produce one or more intermediate states. In some materials, different crystalline phases can also be produced by appropriate selection of the current over time profile. However, what is important for the present application is merely that electrically distinguishable states can be produced.

For example, if the complete layer of phase-change material can have four possible I/V characteristics, two bits of information can be stored in each cell—IF the read cycle can accurately distinguish among the four different states.

(The I/V characteristics of the cells which are not in the fully Set state are typically nonlinear, so it is more accurate to distinguish the states in terms of current flow at a given voltage; resistance is often used as a shorthand term, but implies a linearity which may not be present.)

In order to make use of the possible multibit cell structures, it is necessary to reliably distinguish among the possible states. To make this distinction reliably, there must be some margin of safety, despite the change in characteristics which may occur due to history, manufacturing tolerances, and environmental factors. Thus, the read architecture of multibit PCMs is a far more difficult challenge than it is for PCMs with single-bit cells.

SUMMARY

The present application discloses new phase change memory (PCM) architectures, devices, arrays, subarrays, systems, and methods. The inventors have discovered that, surprisingly, PCM cell read outputs can be decoded by time-domain gating of the state change coming out of the sense amplifiers. Preferably one or more reference cells are connected to generate a transition, at the sense amplifier(s) connected to the reference cell(s), which is intermediate between the times when the different possible stored states generate their transitions. This reference transition then gates propagation of the state of the other sense amplifiers.

In one disclosed class of novel embodiments, this architecture is applied for reading multilevel PCM cells.

In another disclosed class of novel embodiments, a "majority voting" architecture is used to generate the reference transition.

BRIEF DESCRIPTION OF THE DRAWINGS

The disclosed inventions will be described with reference to the accompanying drawings, which show important sample embodiments and which are incorporated in the specification hereof by reference, wherein.

DETAILED DESCRIPTION OF SAMPLE EMBODIMENTS

Figure 1A:
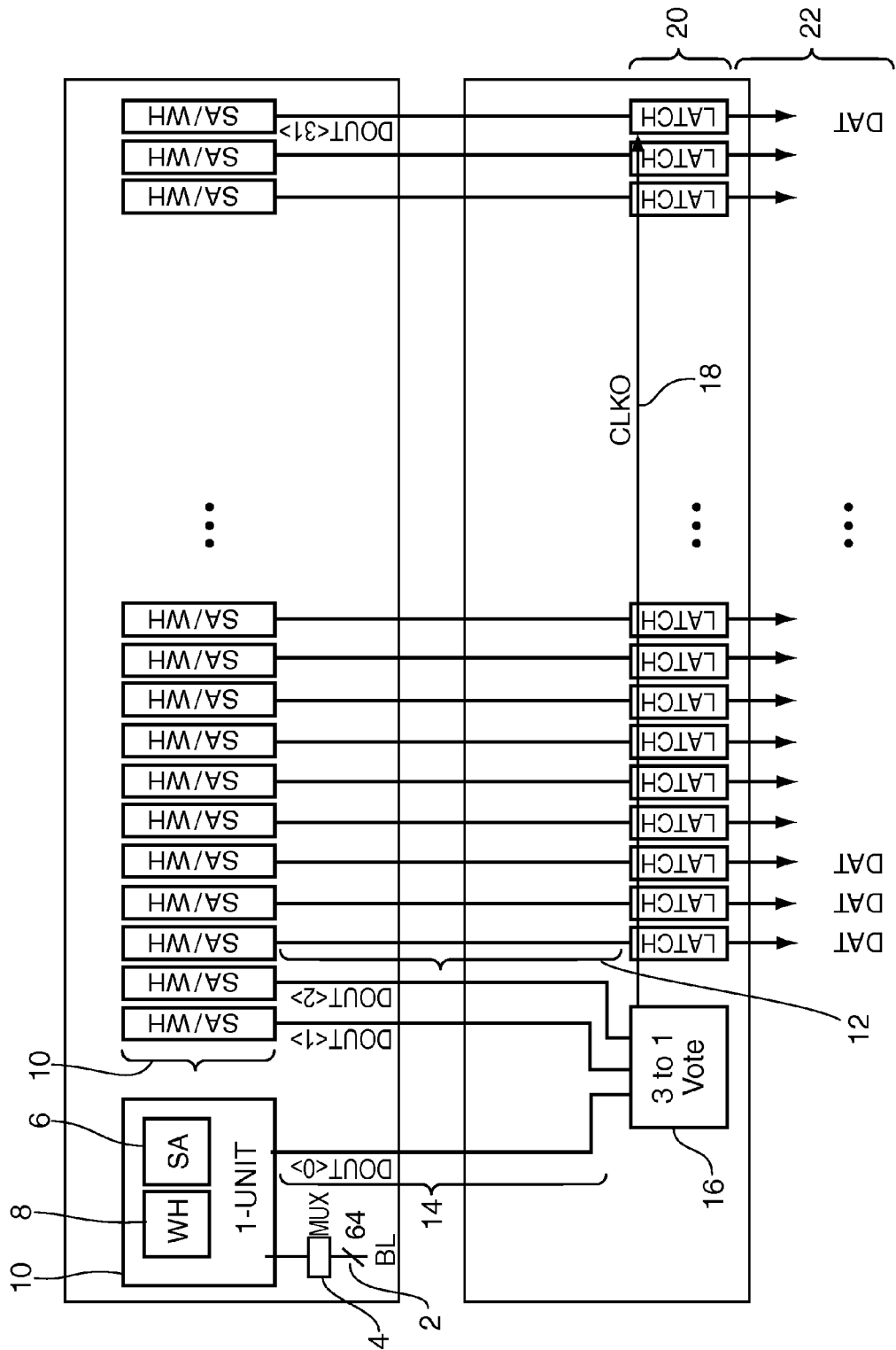
FIG. 1A schematically shows an example of a PCM memory.

The numerous innovative teachings of the present application will be described with particular reference to presently preferred embodiments (by way of example, and not of limitation). The present application describes several inventions, and none of the statements below should be taken as limiting the claims generally.

Examples of implementations for single-bit PCM are described first, but it will be understood that multibit embodiments present additional advantages including increased storage density and attractive synergies with the present inventions.

The present application discloses new phase change memory (PCM) architectures, devices, arrays, subarrays, systems, and methods. The inventors have discovered that, surprisingly, PCM cell read outputs can be decoded by time-domain gating of the state change coming out of the sense amplifiers. Preferably one or more reference cells are connected to generate a transition, at the sense amplifier(s) connected to the reference cell(s), which is intermediate between the times when the different possible stored states generate their transitions. This reference transition then gates propagation of the state of the other sense amplifiers. Time-based decoding enables use of fast, accurate sensing that provides a wide array of synergies with multibit PCM and with various PCM memory features that help maintain sensing accuracy despite resistance drift.

Generally, the higher a PCM cell's resistance, the longer it takes for the cell's read output to change state. State change timing information is preserved by timing units. For two read outputs configured to be received by a single timing unit, the PCM cell corresponding to the read output that transitions first has lower resistance (e.g., a Set resistance) than the PCM cell corresponding to the read output that transitions second (e.g., a Reset resistance).

Reference resistances can be used during memory reads to discriminate between, for example, resistances corresponding to pairs of adjacent logical states. For example, a reference resistance can be between the resistances corresponding to a pair of adjacent logical states.

The inventors have also discovered that, surprisingly, read reliability can be improved by storing such an intermediate reference in multiple reference cells and, when a majority of the reference cell read outputs reach a "vote" unit, propagating a clock signal to timing units. Read outputs are also propagated to timing units. The output of a timing unit configured to receive a clock signal and a read output depends on whether the clock signal or the read output changes state first. Generally, different timing units receive a different read output and/or a different clock signal.

In single-ended sensing embodiments, decoded read outputs depend on whether the read outputs of data-storing cells, or of reference-storing cells (or a corresponding clock signal), change state first.

In differential sensing embodiments, n-state phase change memory cells are organized into groups of n cells, each cell in a group storing a different state. A group of cells collectively encodes one of n! possible states. The collective state encoded by a group of cells is decoded by determining the order in which the read outputs of the cells in the group change state.

The disclosed innovations, in various embodiments, provide one or more of at least the following advantages. However, not all of these advantages result from every one of the innovations disclosed, and this list of advantages does not limit the various claimed inventions.

Provides more accurate memory reads;
lessens error correction requirements;
improves temperature tolerance;
improves resistance drift tolerance;
enables synergies with various memory features that improve resistance drift tolerance;
facilitates use of multibit PCM;
facilitates effective use of higher-density storage configurations;
enables using a single sense amplifier design for a variety of single-bit, multi-bit, single-ended sensing and differential sensing architectures;
enables switching between data storage schemes (e.g., single-ended or differential sensing, and single-bit or multibit PCM);
facilitates broadly flexible and/or mode-switchable architecture design;
simplifies sensing architecture;
reduces sensing architecture size;

reduces manufacturing complexity; and/or
faster reads.

In preferred embodiments, the voltage on a bitline at a given time depends on the resistance of the PCM cell being read by that bitline. Bitlines reading PCM cells with lower resistances reach a target voltage earlier than bitlines reading PCM cells with higher resistances. Sense amplifiers change output state when corresponding bitlines reach the target voltage. Sense amplifier output state change times therefore depend on the resistances of corresponding PCM cells being read.

Sense amplifier outputs that change state earlier transition at timing units earlier. Timing units latch binary output values (i.e., 0 or 1) depending on the order in which sense amplifier outputs transition at the timing units. Timing unit binary outputs can correspond to PCM memory outputs, or can be decoded to produce PCM memory outputs.

In some single-ended sensing single-bit PCM embodiments, bitlines reading data-storing PCM cells (data cells) with lower resistance (e.g., a Set resistance) reach a target voltage faster than bitlines reading data cells with higher resistance (e.g., a Reset resistance). Three bitlines reading reference-storing PCM cells (reference cells) reach the target voltage in an intermediate amount of time. Sense amplifiers generate outputs when corresponding bitlines reach the target voltage. A 3-to-1 vote unit outputs a clock signal when a majority (two) of the sense amplifier outputs corresponding to reference cells transition at the vote unit. Timing units are configured to receive this clock signal and a sense amplifier output corresponding to a data cell. If the clock signal is first to transition at a timing unit, then the corresponding data cell has a higher resistance than the reference cells, and the timing unit latches a binary output (e.g., a 0). If the sense amplifier output is first to transition at the timing unit, then the corresponding data cell has a lower resistance than the reference cells, and the timing unit latches a different binary output (e.g., a 1).

In some single-ended sensing multibit PCM embodiments, multiple 3-to-1 vote units are used, with multiple different references discriminating different pairs of adjacent logical states. For n-state PCM, different ones of n−1 3-to-1 vote units each produce a different clock signal on transition of a majority (two) of the sense amplifier outputs corresponding to one of n−1 different references. Generally, a sense amplifier output corresponding to a data cell will be received by n−1 timing units, different ones of the n−1 timing units receiving different clock signals. The state of the data cell can be decoded (e.g., by specialized decoding logic) based on the order in which a corresponding sense amplifier output and the n−1 clock signals each transition at corresponding timing units.

In some differential sensing single-bit PCM embodiments, a timing unit receives two sense amplifier outputs, corresponding to two different data cells storing complementary binary values. Bitline and sense amplifier operation can be similar to the single-ended sensing single-bit PCM embodiments described above. The sense amplifier output that transitions first at the timing unit corresponds to the data cell with the lower resistance.

In some differential sensing multibit PCM embodiments, for n-state PCM, the collective state encoded by a group of n data cells can be decoded using 1+2+ . . . +n−1 timing units receiving the various possible pairs of n sense amplifier outputs. Timing unit binary outputs depend on the order in which sense amplifier outputs transition at the timing units. The binary outputs of the timing units can be further decoded (e.g., by specialized decoding logic), e.g., to reproduce the values with which the group was written, or, for multiple groups, to reproduce the write input that caused the groups to be written.

In differential decoding, PCM cells are arranged in groups of n PCM cells, and individual PCM cells in a group store different ones of n different logical states. Groups of PCM cells thus encode one of n! (n factorial) different collective states.

In preferred embodiments, sense amplifiers perform a voltage to time conversion. When a bitline voltage that was charged to a precharge voltage ($V_{pre}$) discharges to a sensing threshold voltage ($V_{thr}$) (the target voltage), the output of a sense amplifier connected to sense the bitline changes state (which can also be viewed as the sense amplifier generating an output). This state change occurs AT A PARTICULAR TIME that is primarily dependent on the resistance stored by the PCM cell being read, thus indicating the stored contents of the PCM cell. This timing information is preserved by propagating the sense amplifier output to a timing unit. Timing units receive at least two sense amplifier outputs configured to change state (and therefore, generally, to transition at timing units) at different times. Timing units latch different outputs (e.g., binary outputs) depending on the order in which sense amplifier outputs transition at corresponding timing units. Timing unit outputs can be used to determine what data was written to and stored by corresponding PCM cells being read.

The amount of time it takes for a bitline voltage to drop from $V_{pre}$ to $V_{thr}$ depends on the resistance and capacitance of that bitline. The resistance and capacitance of a bitline reading a PCM cell includes the resistance and capacitance of that PCM cell. It is generally preferable that capacitance be the same (or nearly the same) on all bitlines reading PCM cells, effectively making bitline capacitance a constant. If bitline capacitance is a constant, then the resistance of the PCM cell being read is the predominant variable determining the time for a bitline to discharge from $V_{pre}$ to $V_{thr}$.

The resistance-based read time is a result of the time taken to discharge the bitline capacitance through the bitline resistance. The RC time constant equation for this discharge time is generally a usable (but not perfect) model of this behavior in a PCM context:

$$v(t) = 1 - e^{-\frac{1}{\tau}t} \quad \text{Equation 1}$$

Here, V(t) is the proportion of a target voltage reached by a circuit being continuously discharged (or charged) at time t after discharge (or charge) begins, and τ (tau) is R*C, where R is the bitline resistance and C is the bitline capacitance.

In some embodiments, when a read access begins, all bitlines (and, consequently, the PCM cells being read) are charged to a precharge voltage $V_{pre}$. A time margin can be provided for precharge (e.g., 150% of the minimum time required for approximately full precharge) to ensure full or nearly-full precharge voltage. Nearly-full precharge voltage is generally acceptable, because sensing (decoding) is by comparison between state change timings resulting from bitlines precharged to essentially the same full or nearly-full precharge voltage.

After the bitlines are precharged, the voltage clamp forcing the bitlines to a voltage source's voltage level is released, and the bitlines begin to discharge. Voltage on bitlines reading PCM cells with high resistance drops slower than voltage on bitlines reading PCM cells with low resistance. Thus, the time for a bitline to discharge from $V_{pre}$ to $V_{thr}$ is representative of the resistance (and logical state, if applicable) stored by a PCM cell being read by that bitline.

The time needed for a bitline to discharge from $V_{pre}$ (precharge voltage) to $v_{thr}$ (sensing threshold voltage) is found by reworking Equation 1 to solve for time t in terms of resistance R, and substituting $$\frac{vthr}{vpre}$$

for V(t).

$$t = -RC\ln\left(1 - \frac{vthr}{vpre}\right) \quad \text{Equation 2}$$

The PCM cell resistance is translated into a signal switch latency by the sense amplifier, which is triggered to change its output state (generate an output) when the bitline voltage drops to the sense threshold voltage. That timing is carried through to timing units (e.g., latches). Timing units latch binary outputs when sense amplifier outputs, corresponding to PCM cells with particular resistances, transition at the timing units. This is essentially a comparison between the discharge times for respective bitlines reading corresponding PCM cells (generally, transmission time is relatively small).

A timing unit can, for example, latch on the first of multiple sense amplifier outputs transitioning at the timing unit. Of the PCM cells with read outputs causing the sense amplifier outputs that are configured to be received by the timing unit, the sense amplifier output triggering the timing unit to latch corresponds to the PCM cell with the lowest resistance.

In some embodiments, a sense amplifier output corresponding to a PCM cell storing data (PCM data cell) can be compared to a sense amplifier output corresponding to a PCM cell storing a reference (PCM reference cell). A reference comprises a boundary, or switchover point, discriminating between PCM data cell resistances corresponding to adjacent logical states as stored in a PCM cell. A reference can discriminate between such resistances using state change (sense amplifier output) timing information.

A reference can be chosen to be a resistance between the resistances corresponding to a pair of adjacent logical states to be discriminated by the reference. This means a sense amplifier output corresponding to a PCM reference cell will transition at a timing unit between sense amplifier outputs corresponding to the logical states discriminated by the reference.

Discrimination by a reference between a pair of adjacent logical states also comprises discriminating between logical states corresponding to PCM cell resistances lower than the reference resistance, and logical states corresponding to PCM cell resistances higher than the reference resistance (with a margin of error related to factors which can include, e.g., data path component response times, data path transmission time, and variation of reference resistance as written from intended reference resistance).

FIG. 1A schematically shows an example of a PCM memory, and specifically a read path for single-ended sensing of single-bit PCM cells. After precharge, bitlines where the accessed PCM cell is in a low-resistance state (e.g. a "Set" state) will change voltage faster than bitlines connected to a high-resistance state ("Reset" state). The sense amp connected to each bitline will preferably transition once the bitline voltage crosses a certain level, so the sense amp's output DOUT will transition sooner for bitlines where the accessed cell is in the low-resistance state. Since the reference PCM cells are designed to present an intermediate resistance, the sense amps connected to the reference PCM cells will transition after those connected to low-resistance PCM cells, but before those connected to high-resistance PCM cells.

In this example, a 3-to-1 Vote unit 16 drives line CLK0 active as soon as a majority (two) of the sense amplifier reference outputs 14 transition at the 3-to-1 Vote Unit 16. When CLK0 goes active, latches 20 will each latch a respective sense amplifier output DOUT onto a data line DAT. If the respective DOUT line has already transitioned at that time, the transitioned state will be latched onto the DAT line, indicating a SET cell. If the respective DOUT line has not yet transitioned when CLK0 transitions, the untransitioned state will be latched onto the DAT line, indicating a RESET cell. Note that the sense amp outputs DOUT for RESET cells will transition eventually, but, once CLK0 has activated the latches, the state of the DOUT lines is irrelevant. Note that the logic in latches 20 can make a SET state correspond to a logic "0" or a logic "1", whichever is desired.

When a group of PCM cells (a number of PCM cells configured to be read together, e.g., a word) is accessed to be read, corresponding bitlines 2 are precharged to a precharge voltage.

In this example multiplexers 4 (MUX) are used to select from a group of bitlines 10 the corresponding bitline 2 carrying the read output of a PCM cell being read, and direct that read output to a corresponding sense amplifier 6. In FIG. 1A, sense amplifiers 6 and write heads 8 (used during PCM cell write accesses) are part of combined SA/WH units 10 (sense amplifier/write head units 10). SA/WH units 10 are severally attached to respective groups of bitlines 2 (e.g., 64 bitlines per SA/WH unit 10) and multiplexers 4 (generally, one per SH/WH unit 10). (FIG. 1A shows all of this only for one example SA/WH unit 10. This is due to drawing shorthand, and does not reflect or imply absence in corresponding embodiments.)

Once the corresponding bitlines 2 are precharged, the voltage clamp is removed and they are allowed to discharge. When a bitline 2 has discharged to a sense threshold voltage, its corresponding sense amplifier output 12 will transition. The time from voltage clamp removal to sense amplifier output transition is determined by the resistance of the corresponding bitline 2, assuming the capacitances of the bitlines 2 are nearly equal. Typically, the bitline resistance is predominantly the resistance of the PCM cell being read using that bitline 2. (There can be a small process-dependent leakage current also.)

Three of the PCM cells being read (with sense amplifier outputs 12 connected to a 3-to-1 Vote unit 16) contain a reference resistance (PCM reference cells), and the rest of the PCM cells being read contain data (PCM data cells). PCM reference cell read outputs result in corresponding sense amplifiers 6 outputting sense amplifier reference outputs 14. Once a majority of the PCM reference cell read outputs (here, two out of three) cause corresponding sense amplifier reference outputs 14 to be outputted, and the sense amplifier reference outputs 14 transition at the 3-to-1 Vote unit 16, the 3-to-1 Vote unit 16 outputs CLK0 18 (a clock signal). CLK0 18 is used as a reference with respect to sense amplifier outputs 12. LATCH units 20 latch and output different binary data outputs 22 depending on whether CLK0 18 or a sense amplifier output 12 (corresponding to a PCM data cell being read) is outputted and transitions at the LATCH unit 20 first.

Binary data outputs 22 generally correspond to the binary values originally written to corresponding PCM data cells.

The signal transitioning at the LATCH unit 20 first does so as a result of shorter discharge time(s), starting at (approximately) the precharge voltage at voltage clamp release, and ending at the sense threshold voltage. Shorter time(s) result from lower resistance(s) of the PCM cell(s) being read, while longer time(s) result from higher resistance(s) of the PCM cell(s) being read.

Actual resistances of PCM cells as written vary somewhat from intended resistances. This results in variation in sense amplifier output 12 timings during read accesses. Use of the 3-to-1 Vote unit 16 reduces the likelihood of outlier values for CLK0 18 output timing (and generally reduces probable variation in CLK0 18 output timing), since the sense amplifier reference output 14 with the median timing triggers CLK0 18 output. This results in a more reliable time-based reference. A more reliable reference means a greater effective sense margin, and thus more reliable PCM reads.

Figure 1B:
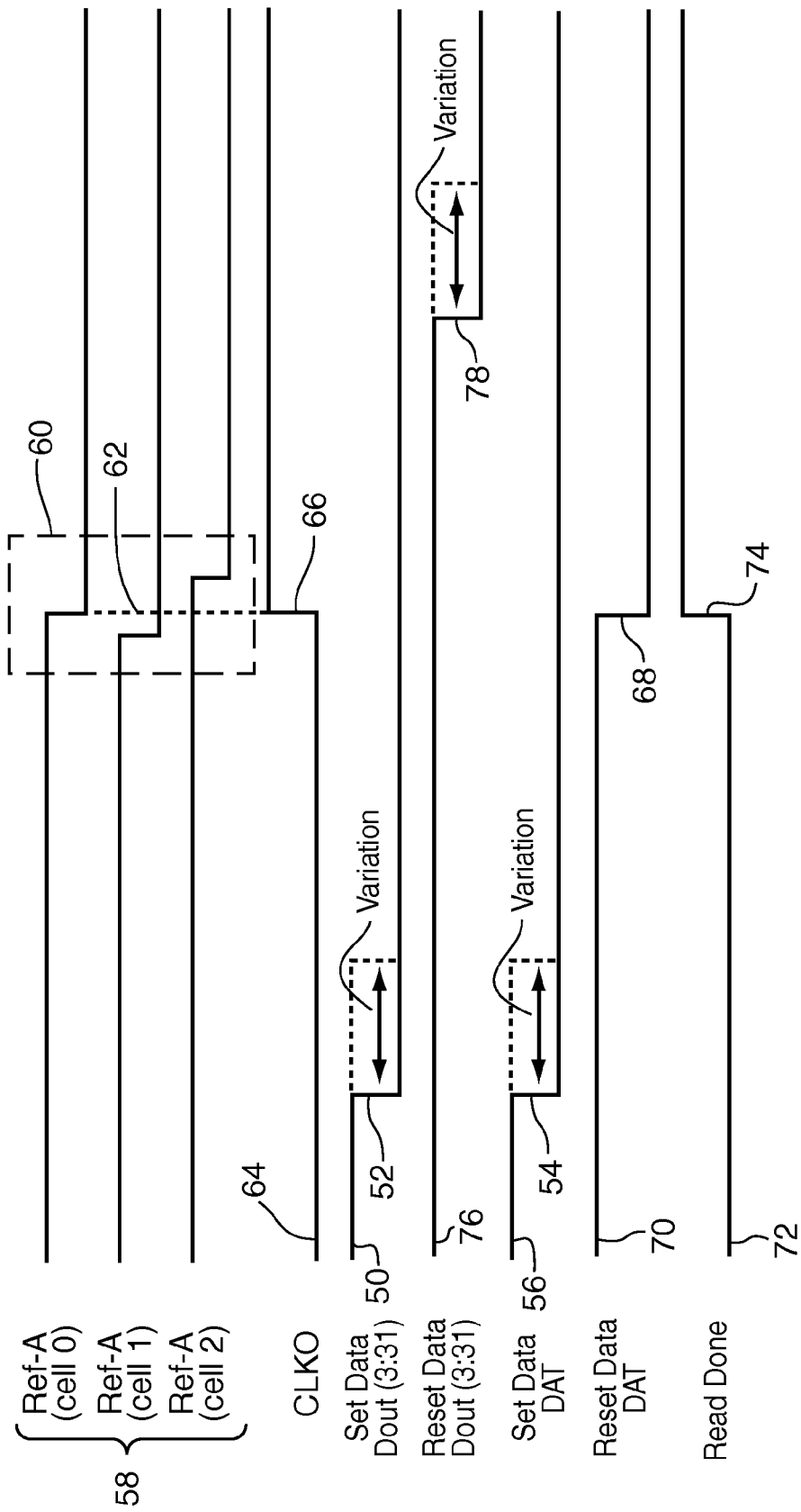
FIG. 1B shows an example of a timing diagram for PCM memory reads.

FIG. 1B shows an example of a timing diagram for single-bit (2-level) time-based decoding PCM memory reads. There is some variation in the timing of state changes as shown in timing figures (FIGS. 1B, 4B and 6B), because resistances of PCM cells as written typically vary from intended resistances.

As shown in FIG. 1B, a clock signal CLK0 64 transitions (at time 66) once a majority of sense amplifier reference outputs Ref-A (labeled as 14 or 58) have transitioned (in the time period 60). If a sense amplifier output 12 transitions before CLK0 transitions, then it corresponds to a data cell with a lower resistance than the reference cells—i.e., an output like Set Data 50 output. In this case, a corresponding binary output Set Data DAT 56 can be latched 54 at approximately the time of Set Data Dout 50 output 52.

If the sense amplifier output 12 is outputted after CLK0 64, then it is a sense amplifier output 12 corresponding to a data cell with a higher resistance than the reference cells—i.e., a Reset Data Dout 76 output 78. In this case, a corresponding binary output Reset Data DAT 70 can be latched 68 at approximately the time of CLK0 64 output 66.

Once CLK0 64 is output 66, a Read Done 72 signal can be outputted 74. Embodiments as shown in FIG. 1B can realize a read cycle speed advantage because it is unnecessary to wait for Reset Data Dout 76 output 78 to produce PCM memory outputs.

In embodiments corresponding to FIG. 1B, Set Data Dout 50 corresponds to sense amplifier outputs 12 of PCM cells written with Set, which are the first sense amplifier outputs 12 to change state 52 (sense amplifiers output when sense amplifier outputs change state). Once Set Data Dout 50 changes state 52, the state change 52 is propagated to corresponding timing units (e.g., LATCH units 20) and causes them to change state 54, outputting binary data output 22 SET Data DAT 56. A Set Data DAT 56 output indicates that a corresponding PCM cell is storing a Set state.

Three PCM reference cells storing the same reference correspond to sense amplifier reference outputs 14 Ref-A 58. PCM reference cells corresponding to Ref-A have higher resistance than PCM data cells storing Set, and lower resistance than PCM data cells storing Reset. Ref-A 58 change state 60 (are outputted by sense amplifiers 6) after Set Data Dout 50. When a majority of the Ref-A 58 sense amplifier reference outputs 14 change state 60, and the majority-making Ref-A 58 state change 60 is propagated to and received by 62 a 3-to-1 Vote unit 16, a clock signal CLK0 64 changes state 66. Timing units (e.g., LATCH units 20) to which a CLK0 64 state change 66 is propagated first—before a sense amplifier output 12 state change—change state 68, outputting binary output 22 Reset Data DAT 70. A Reset Data DAT 70 output indicates that a corresponding PCM cell is storing a Reset state.

Once CLK0 64 changes state 66, it causes a Read Done 72 to change state 74, indicating that the PCM cell decoding is complete. Total read time can be shortened by not waiting for Reset Data Dout 76 to change state 78 before outputting Read Done 72.

Figure 1C:
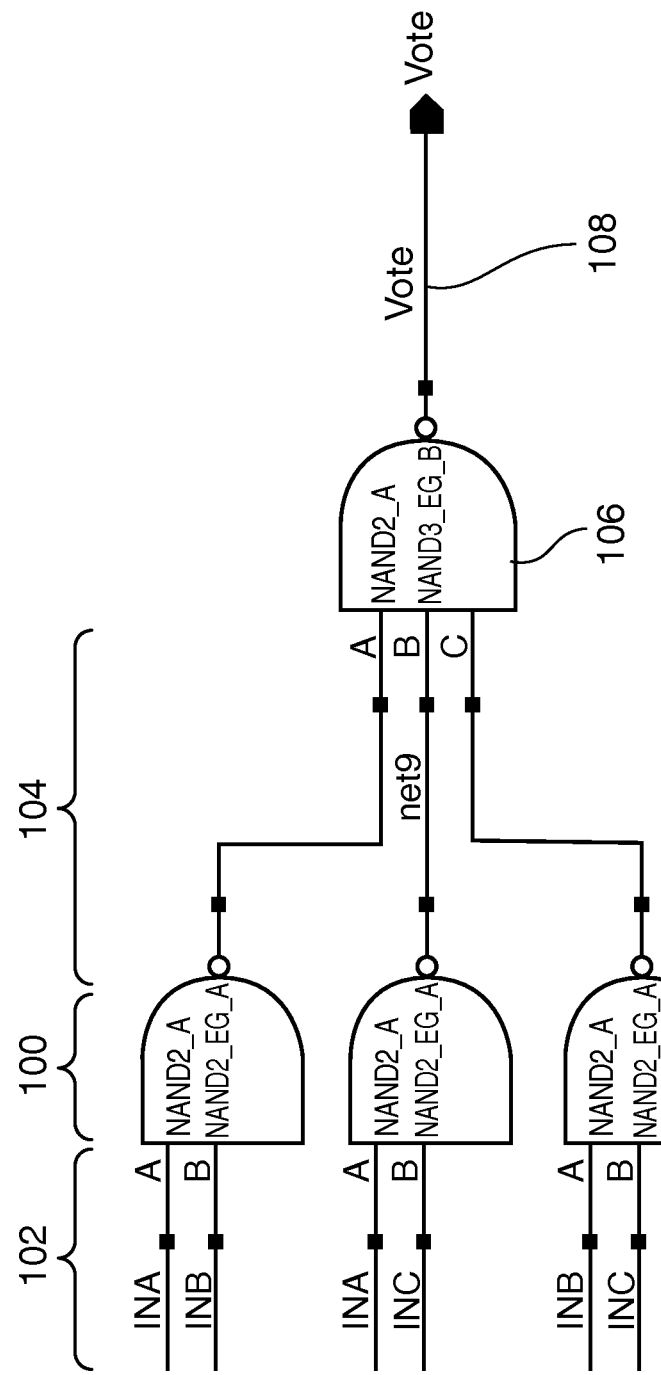
FIG. 1C shows an example of gate logic for a 3-to-1 Vote unit.
Figure 2A:
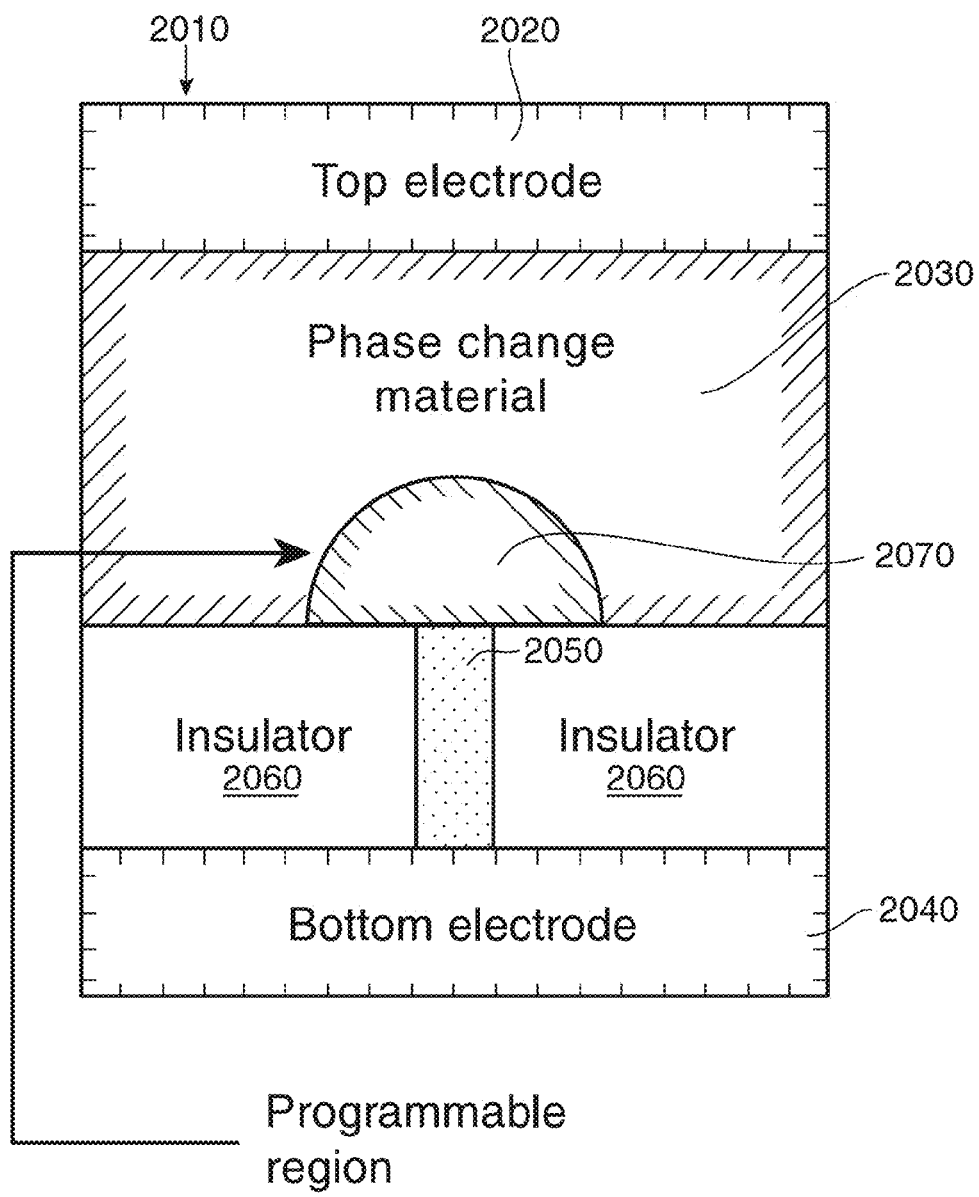
FIG. 2A shows an example of a PCM element.
Figure 2B:
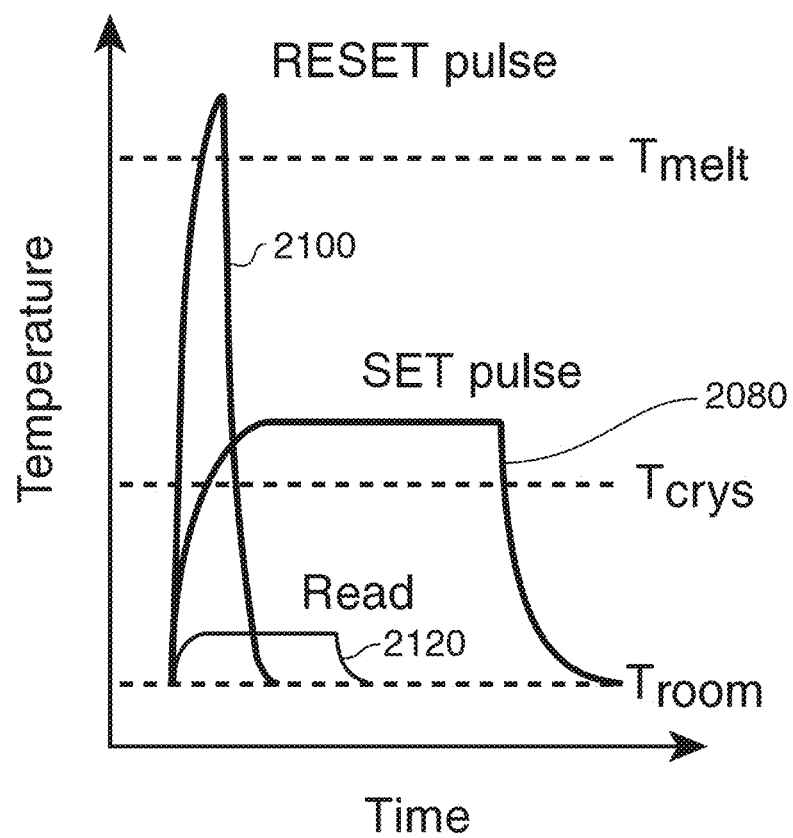
FIG. 2B shows an example of PCM bit line signals.
Figure 2C:
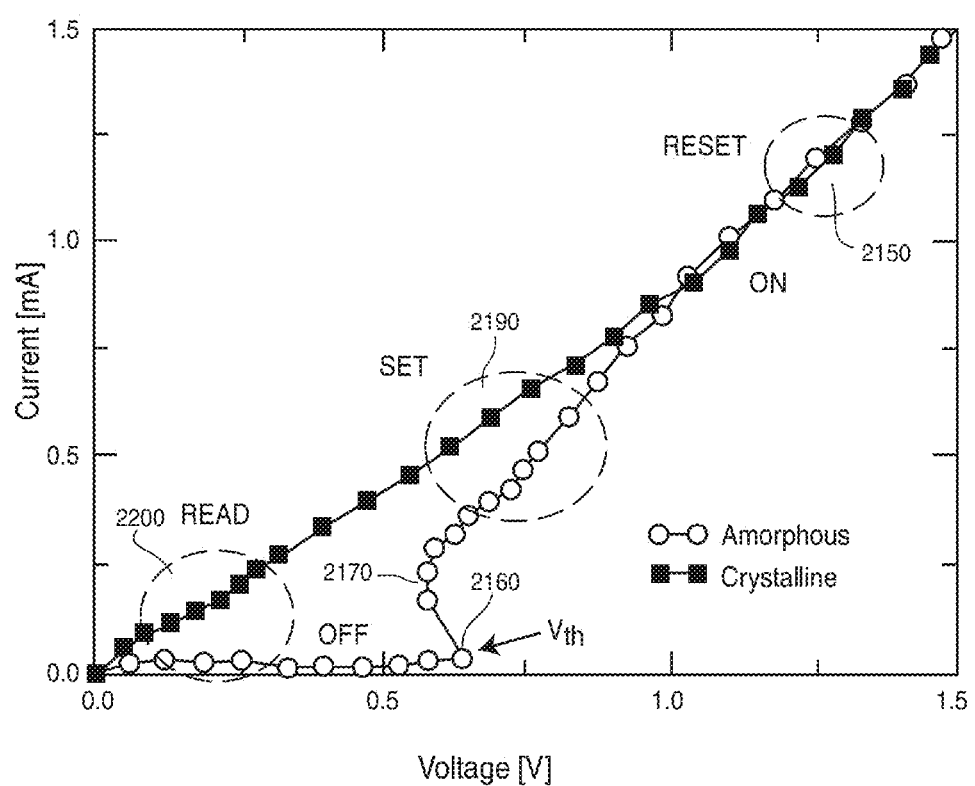
FIG. 2C shows an example of voltage versus current in a PCM material.
Figure 2D:
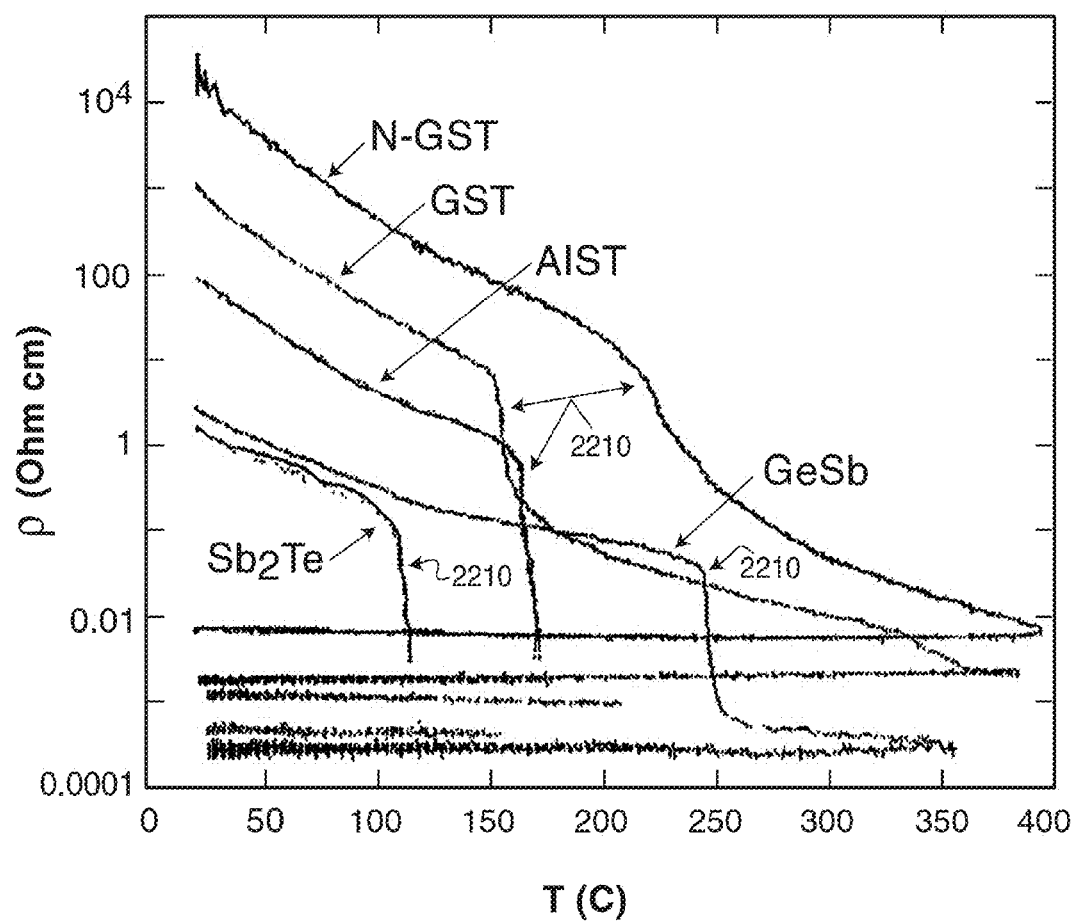
FIG. 2D shows an example of temperature versus resistance in a PCM material.
Figure 2E:
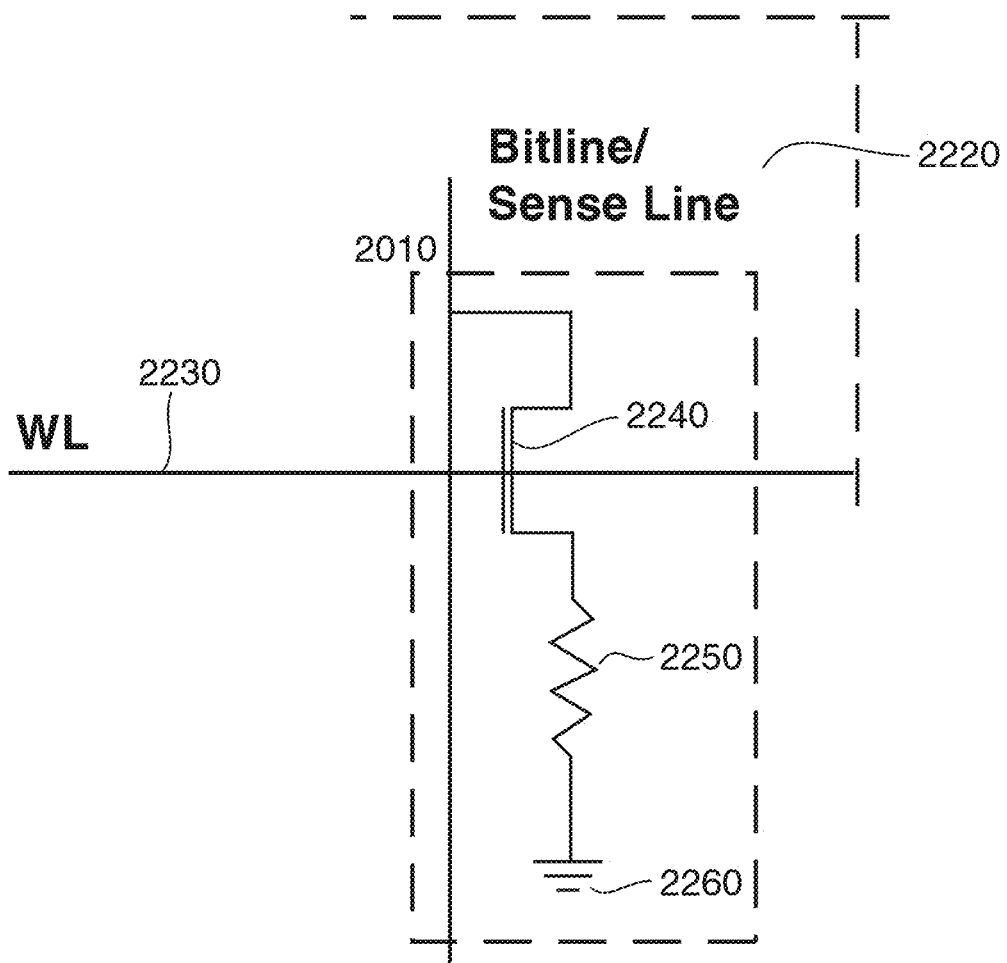
FIG. 2E shows an example of a PCM cell.
Figure 2F:
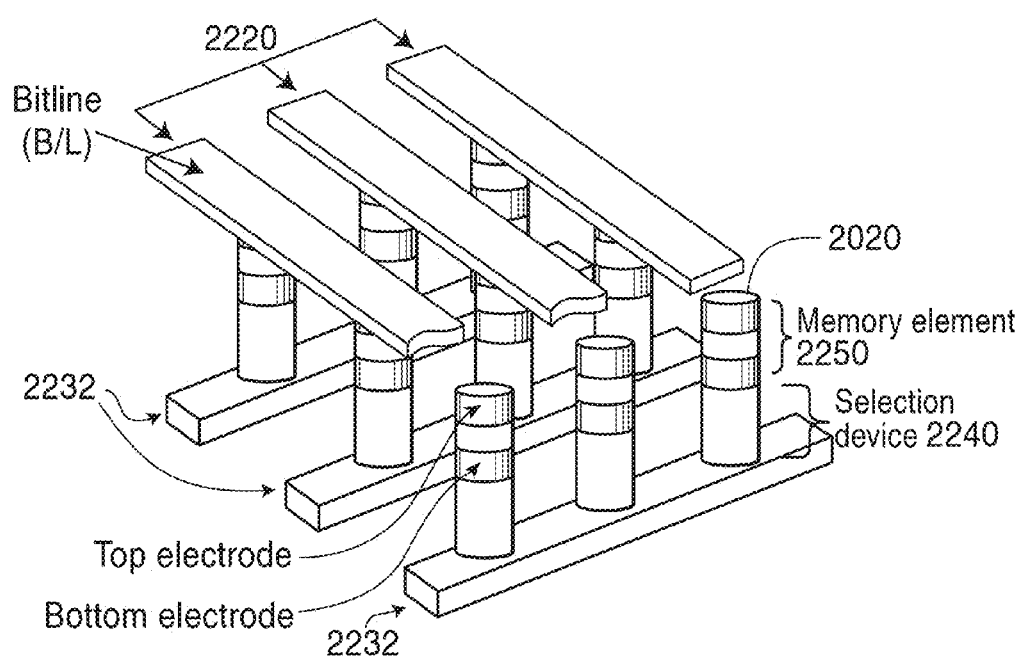
FIG. 2F shows an example of a PCM cell.
Figure 2G:
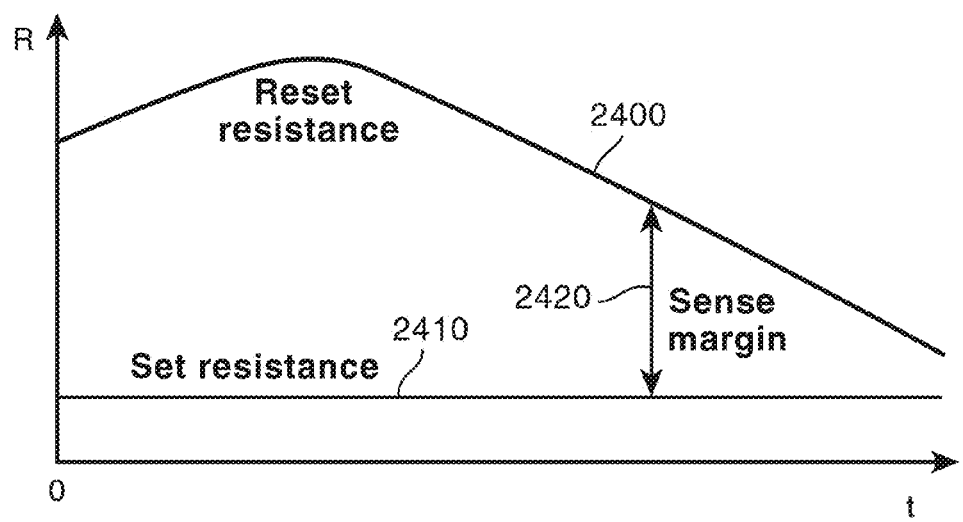
FIG. 2G shows an example of resistance over time for a PCM cell.
Figure 2H:
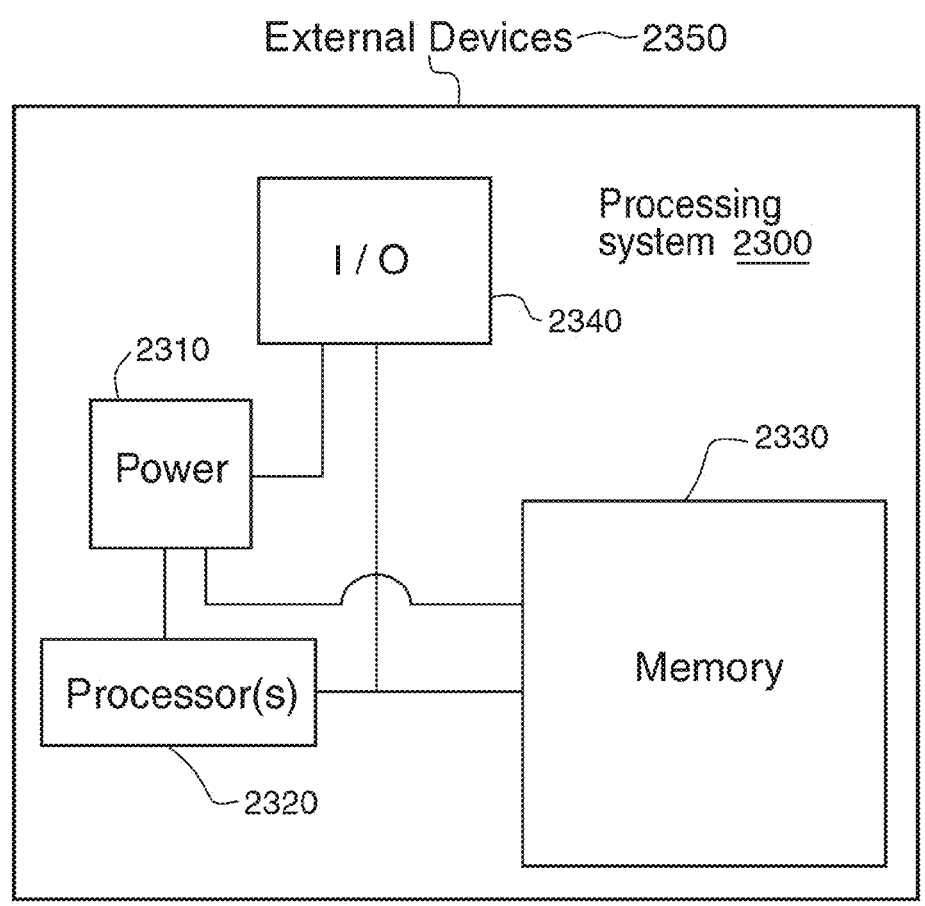
FIG. 2H shows an example of a processing system.
Figure 2I:
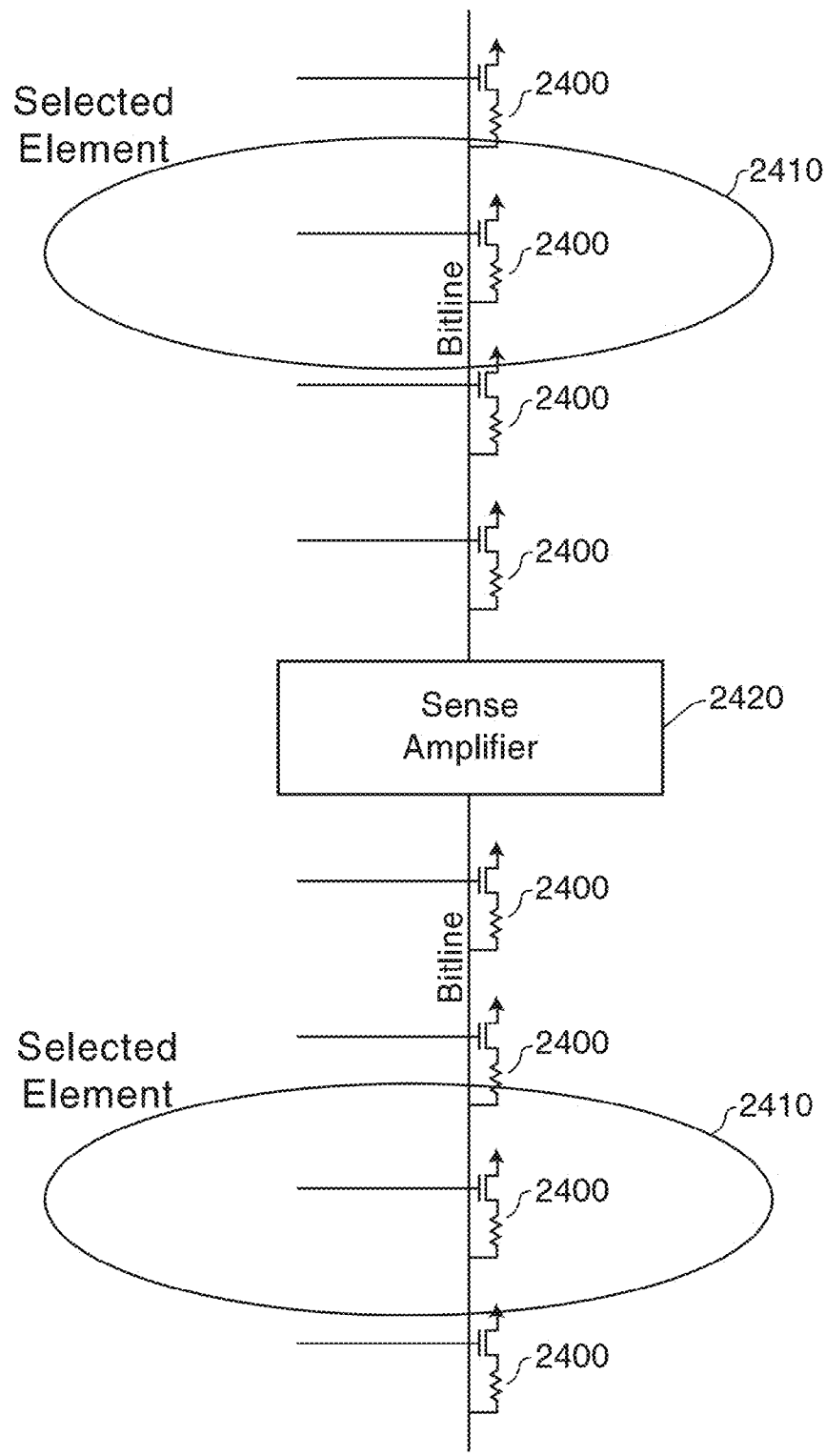
FIG. 2I shows an example of a PCM single-ended sensing memory.
Figure 2J:
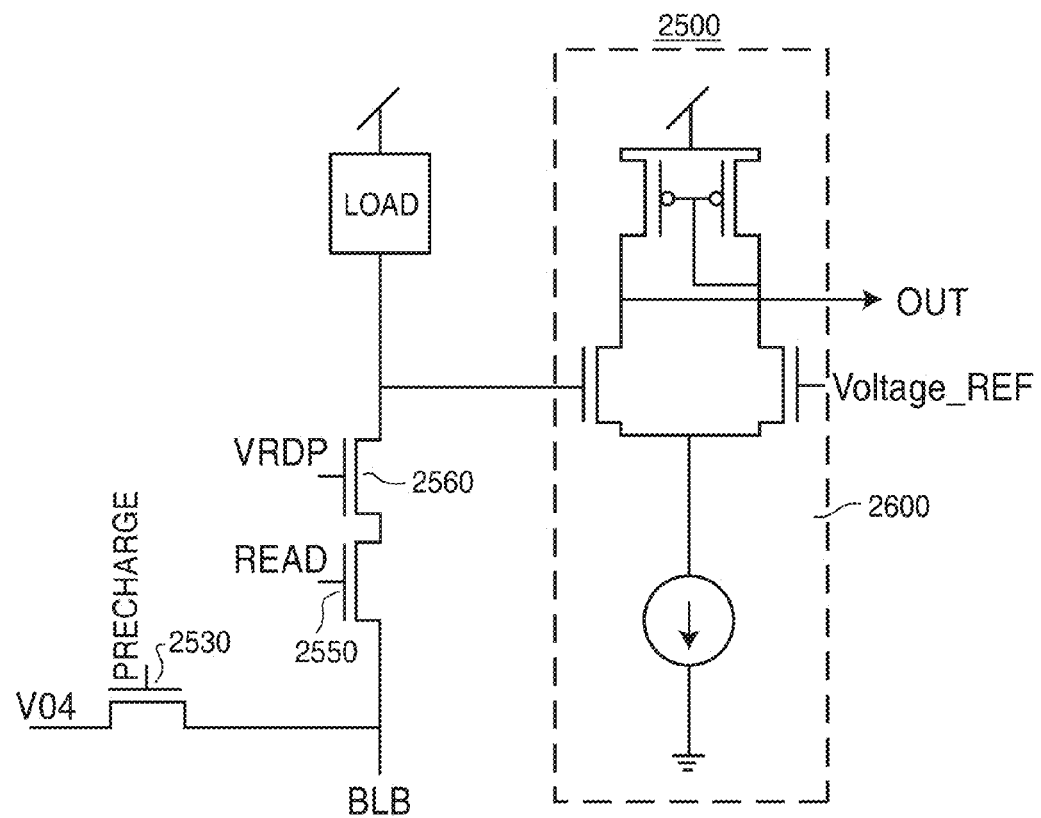
FIG. 2J shows an example of a known PCM single-ended sense amplifier.

FIG. 1C shows an example of gate logic for a 3-to-1 Vote unit. For inputs A, B and C, this gate logic determines the Boolean result (AB+AC+BC). Any pair of two TRUE inputs will produce a TRUE output.

Three initial NAND logic gates 100 each take a different pair of inputs 102 chosen from three total inputs. Inputs correspond to sense amplifier reference outputs 14. The outputs of the three initial NAND logic gates 104 are input into a fourth NAND logic gate 106. The output of the fourth NAND logic gate 108 corresponds to CLK0 signal 18, 64.

Figure 3:
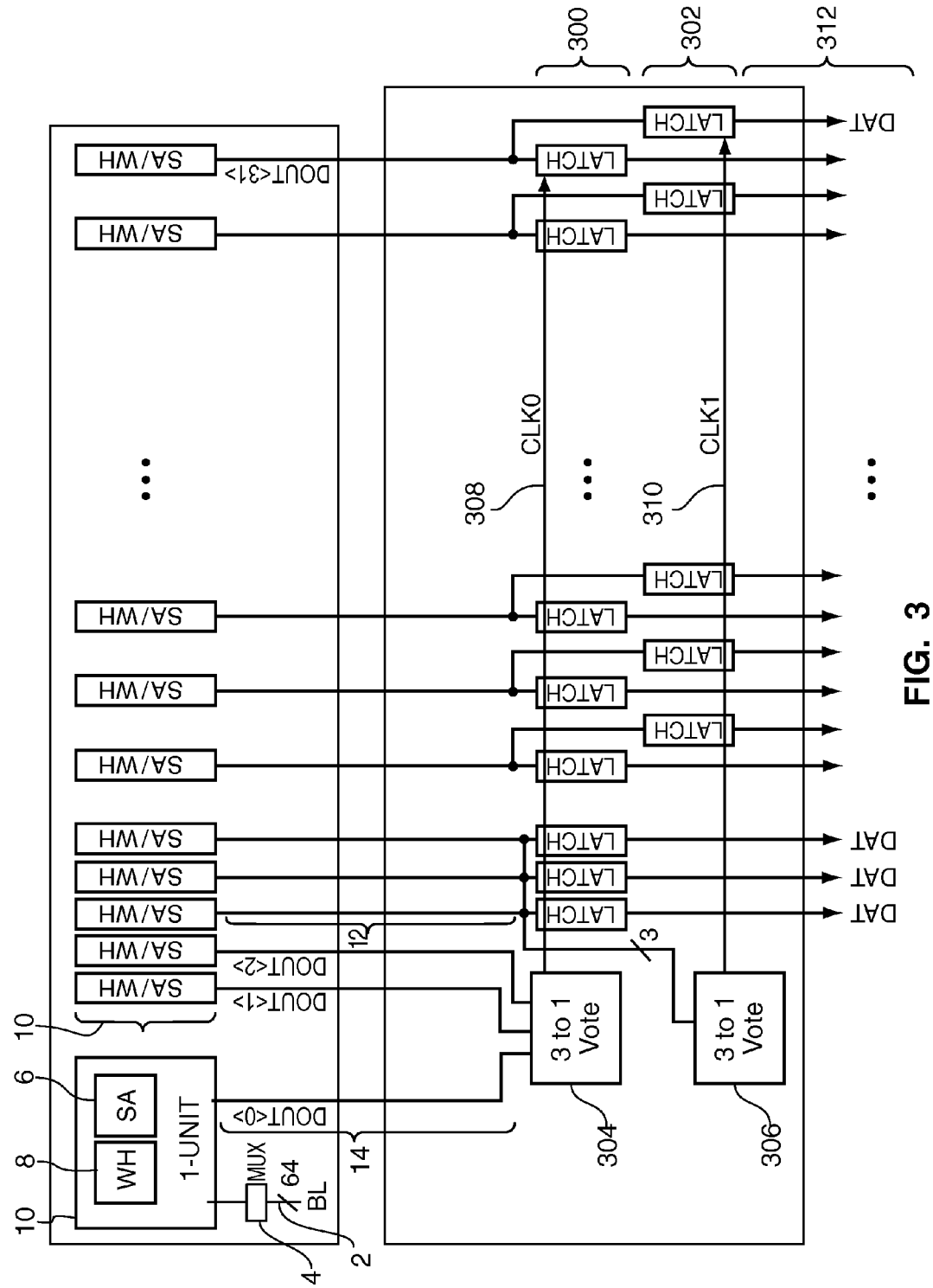
FIG. 3 schematically shows an example of a PCM memory.

FIG. 3 schematically shows an example of a 3-level multi-bit PCM time-based single-ended decoding configuration. Bitline 2 and sense amplifier 6 functions are similar to those in embodiments as shown in FIG. 1A. Here, two different references (corresponding to two different sets of three reference cells each) and two 3-to-1 Vote units 304, 306 are used to produce two different clock signals CLK0 308 and CLK1 310 in order to discriminate between the two different pairs of adjacent 3-level logical states. Individual sense amplifier outputs 12 corresponding to data cells are received by two different LATCH units 300, 302. LATCH units 300 also receive CLK0 308, while LATCH units 302 receive CLK1 310. Sense amplifier outputs 12 can transition at corresponding LATCH units 300, 302 before, between or after clock signals CLK0 308 and CLK1 310. The resulting two bits of binary output 312 from a pair of LATCH units 300, 302 corresponding to a data cell thus indicate whether the data cell stores a resistance lower than, between, or higher than the two different resistances of the two different references.

In embodiments corresponding to FIG. 3, individual sense amplifier outputs 12 corresponding to individual PCM data cell read outputs are configured to be received by two LATCH units 300, 302 (rather than one LATCH unit 20, as in FIG. 1A).

Two 3-to-1 Vote units 304, 306 generate two different clock signals, respectively CLK0 308 and CLK 1 310. 3-to-1 Vote units 304, 306 respectively output clock signals CLK0 308 and CLK1 310 when a majority of their respective sense amplifier reference outputs 14 transition at the 3-to-1 Vote units 304, 306. 3-to-1 Vote units 304, 306 can, for example, use the logic gate arrangement shown in FIG. 1C.

CLK0 308 and CLK1 310 are each based on one of two different references, and discriminate correspondingly different pairs of adjacent logical states. For example, references can be chosen such that times t(R) (time t as a function of resistance R) from voltage clamp release to sense amplifier output state change, for resistances corresponding to various PCM states (logical states) and clock signals, obey the following inequality: t(lowest R PCM state)<t(CLK0 320)<t (middle R PCM state)<t(CLK1 325)<t(highest R PCM state).

CLK0 308 is configured to be received by different ones of the pair of LATCH units 300, 302 corresponding to individual PCM data cells than CLK1 310. LATCH units 300, 302 produce different binary outputs 312 depending on whether a sense amplifier output 12 or a clock signal (CLK0 308 or CLK1 310, respectively) transitions first.

Three LATCH units 300 are configured to receive sense amplifier reference outputs 14 corresponding to one of the two references, as well as a clock signal CLK0 308 corresponding to the other reference. The binary outputs 312 of these three LATCH units 300 can serve as a check that PCM reference cells are being written and read properly.

Figure 4A:
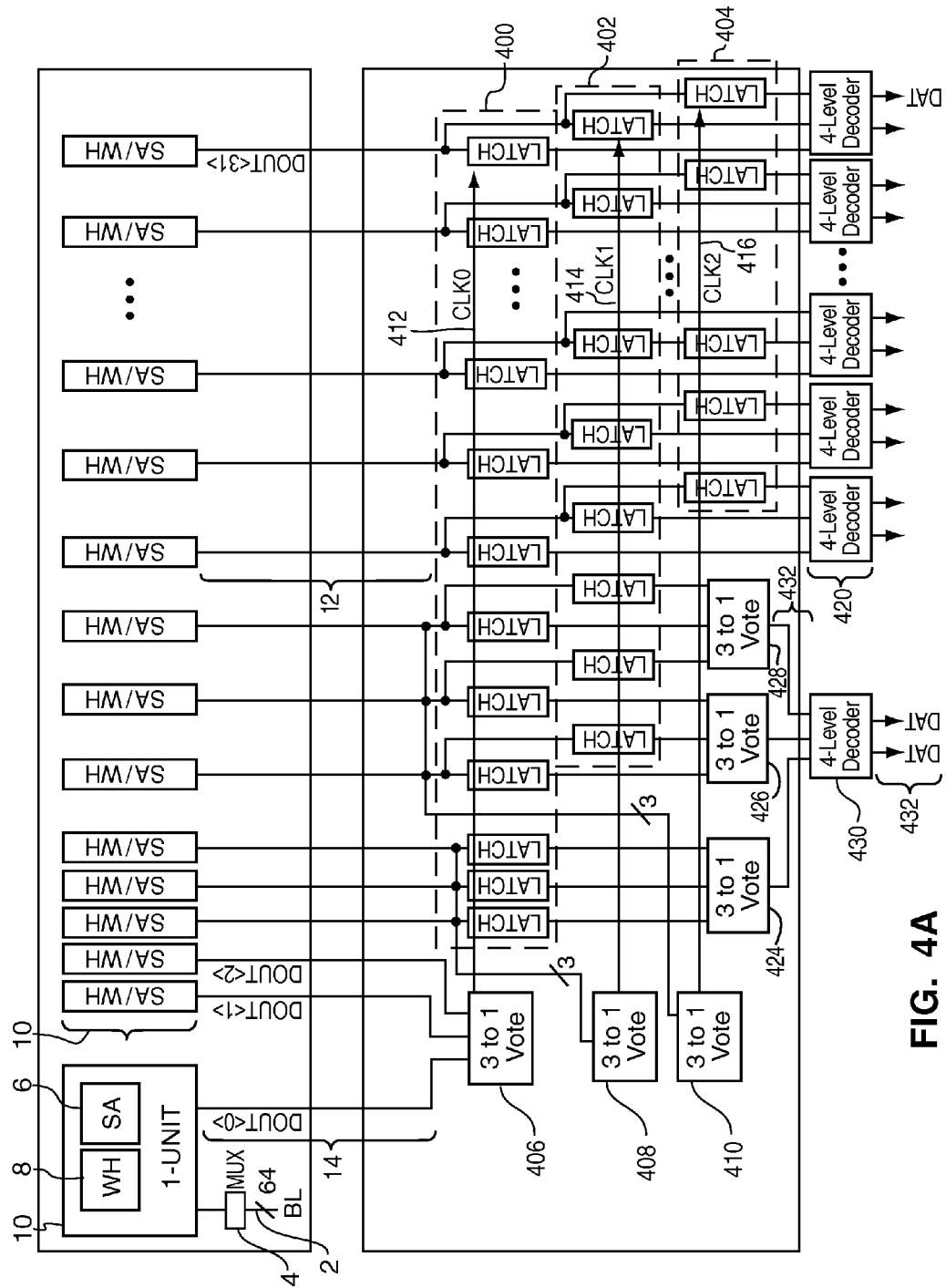
FIG. 4A schematically shows an example of a PCM memory.

FIG. 4A shows an example of a 4-level multibit PCM single-ended decoding configuration. Bitline 2 and sense amplifier 6 functions are similar to those in embodiments as shown in FIG. 1A. Here, three different references (corresponding to two different sets of three reference cells) and three 3-to-1 Vote units 406, 408, 410 are used to produce three different clock signals CLK0 412, CLK 1 414 and CLK2 416 in order to discriminate between the three different pairs of adjacent logical states in 4-level multibit PCM.

Individual sense amplifier outputs 12 corresponding to data cells are received by three different LATCH units 400, 402 and 404. LATCH units 400 receive CLK0 412, while LATCH units 402 receive CLK1 414 and LATCH units 404 receive CLK2 416. Sense amplifier outputs 12 can transition at corresponding LATCH units 400, 402, 404 before, between an adjacent pair of, or after clock signals CLK0 412, CLK1 414, and CLK2 416. The resulting three bits of encoded binary output 418 from a triple of LATCH units 400, 402, 404 corresponding to a data cell indicate whether the data cell stores a resistance lower than, between a pair of, or higher than the three different resistances of the three different references. Encoded binary output 418 triples are decoded by corresponding 4-Level Decoders 420 to produce decoded binary data outputs 422. Decoded binary data outputs 422 can be, for example, the binary values written to corresponding data cells, or values contained in the read instruction that caused the data cells to be written.

In some sample embodiments corresponding to FIG. 4A, individual sense amplifier outputs 12 corresponding to individual PCM data cell read outputs are configured to be received by three LATCH units 400, 402, 404.

Three 3-to-1 Vote units 406, 408, 410 generate three different clock signals, respectively CLK0 412, CLK 1 414, and CLK2 416. When a majority of respective sense amplifier reference outputs 14 transitions at a 3-to-1 Vote unit it outputs its respective clock signal CLK0 412, CLK1 414 or CLK2 416. 3-to-1 Vote units 406, 408 and 410 can, for example, use the logic gate arrangement shown in FIG. 1C.

CLK0 412, CLK1 414 and CLK2 416 are each based on one of three different references, and discriminate, correspondingly, between different pairs of adjacent logical states. For example, references can be chosen such that times t(R) (time t as a function of resistance R) from voltage clamp release to sense amplifier output state change, for resistances corresponding to various PCM states (logical states) and clock signals, obey the following inequality: t(lowest R PCM state)<t(CLK0 412)<t(lower middle R PCM state)<t(CLK1 414)<t(upper middle R PCM state)<t(CLK2 416)<t(highest R PCM state).

CLK0 412, CLK1 414 and CLK2 416 are each configured to be received by different ones of the three LATCH units 400, 402, 404 corresponding to individual PCM data cells. A LATCH unit 400, 402 or 404 produces different encoded binary outputs 418 depending on whether a sense amplifier output 12 or a clock signal (CLK0 412, CLK1 414 or CLK2 416, respectively) received by the LATCH unit 400, 402 or 404 transitions first.

Encoded binary outputs 418 from LATCH units 400, 402, 404 are decoded by 4-Level Decoders 420. Resulting decoded binary data outputs 422 can correspond to, for example, logical states with which corresponding PCM data cells were written, or to binary data as received by the PCM memory in one or more write requests that caused corresponding PCM cells to be written.

Three 3-to-1 Vote units 424, 426, 428 are configured to receive outputs of various LATCH units 400, 402 that variously receive sense amplifier reference outputs 14 corresponding to two of the three references (the references corresponding to CLK1 414 and CLK2 416), and are variously clocked by clock signals CLK0 412 and CLK1 414. Inputs to the 3-to-1 Vote units 424, 426, 428 are arranged so that there is an expected time-ordering to their outputs. The outputs of the 3-to-1 Vote units 424, 426, 428 are decoded by a 4-Level Decoder 430, which produces binary outputs 432 that indicate whether PCM reference cells are being written and read properly.

Figure 4B:
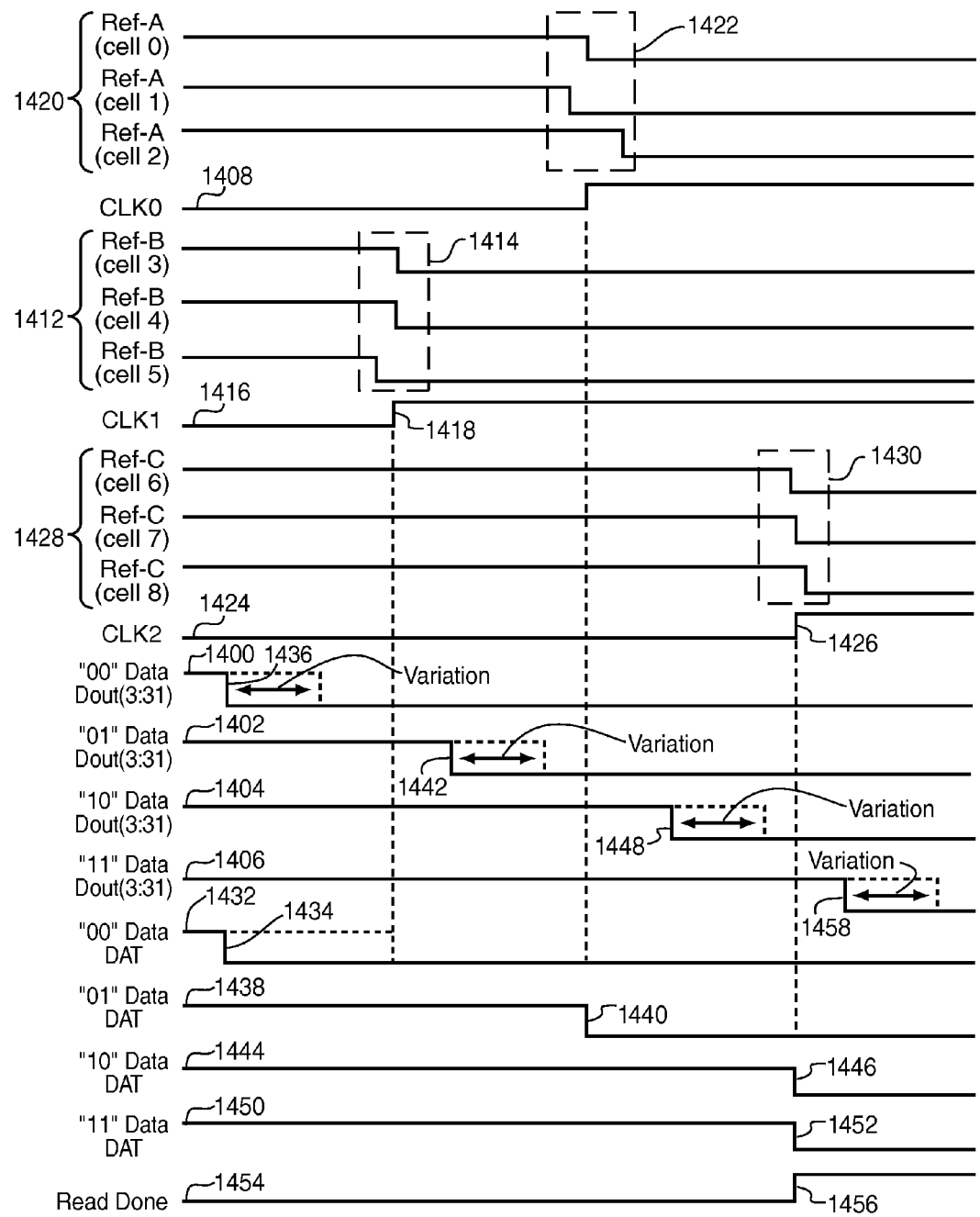
FIG. 4B shows an example of a timing diagram for PCM memory reads.

FIG. 4B shows an example of a timing diagram for 4-level multibit PCM time-based single-ended decoding.

As shown in FIG. 4B, clock signals CLK0 1408, CLK1 1416 and CLK2 1424 are outputted 1410, 1418, 1426 once a majority (two) of sense amplifier reference outputs 14, 1412, 1420, 1428 corresponding to the respective different references are outputted 1414, 1422, 1430. If a sense amplifier output 12 is outputted before CLK0 1408, then it is a sense amplifier output 12 corresponding to a data cell with a lower resistance than the reference cells—i.e., "00" Data Dout 1400 output 1436. A corresponding binary output "00" Data DAT 1432 can be latched 1434 at approximately the time of "00" Data Dout 1400 output 1436. (Typically, transmission time from sense amplifiers to corresponding timing units is relatively short.)

If the sense amplifier output 12 is outputted between CLK0 1408 and CLK1 1416, then it is a sense amplifier output 12 corresponding to a data cell with a resistance between the references corresponding to CLK0 1408 and CLK1 1416—i.e., a "01" Data Dout 1402 output 1442. A corresponding binary output "01" Data DAT 1438 can be latched 1440 at approximately the time of CLK1 1416 output 1418.

If the sense amplifier output 12 is outputted between CLK1 1416 and CLK2 1424, then it is a sense amplifier output 12 corresponding to a data cell with a resistance between the references corresponding to CLK1 1416 and CLK2 1424—i.e., a "10" Data Dout 1404 output 1448. A corresponding binary output "10" Data DAT 1444 can be latched 1446 at approximately the time of CLK2 1424 output 1426.

If the sense amplifier output 12 is outputted after CLK2 1424, then it is a sense amplifier output 12 corresponding to a data cell with a resistance higher than the references corresponding to CLK2 1424—i.e., a "11" Data Dout 1406 output 1458. A corresponding binary output "11" Data DAT 1450 can be latched 1452 at approximately the time of CLK2 1424 output 1426.

Once CLK2 1424 is output 1426, a Read Done 1452 signal can be outputted 1454. Embodiments as shown in FIG. 4B can realize a read cycle speed advantage because it is unnecessary to wait for "11" Data Dout 1406 output 1458 to produce PCM memory outputs (e.g., by decoding the various binary outputs).

As shown in FIG. 4B, sense amplifier outputs 12 "00" Data Dout 1400, "01" Data Dout 1402, "10" Data Dout 1404, and "11" Data Dout 1406 respectively correspond to PCM cells storing "00", "01", "10" and "11" logical states. In embodiments as shown in FIG. 4B, "00" is the lowest-resistance state.

CLK0 1408 changes state 1410 after a majority of sense amplifier reference outputs 14 Ref-B 1412 change state 1414, and the state changes 1414 are propagated to a corresponding Vote unit. Ref-B 1412 corresponds to the lowest-resistance reference.

CLK1 1416 changes state 1418 after a majority of sense amplifier reference outputs 14 Ref-A 1420 change state 1422, and the state changes 1422 are propagated to a corresponding Vote unit. Ref-A 1420 corresponds to the middle-resistance reference.

CLK2 1424 changes state 1426 when a majority of sense amplifier reference outputs 14 Ref-C 1428 change state 1430, and the state changes 1430 are propagated to a corresponding Vote unit. Ref-C corresponds to the highest-resistance reference.

"00" Data DAT 1432 changes state 1434, outputting decoded binary data 422, after "00" Data Dout 1400 changes state 1436, the state change 1436 is propagated to corresponding timing units, and resulting timing unit outputs are propagated to corresponding 4-level decoders.

"01" Data DAT 1438 changes state 1440, outputting decoded binary data 422, after "01" Data Dout 1402 changes state 1442; CLK0 1408 changes state 1410; CLK1 1416 changes state 1418; state changes 1410, 1418, 1442 are propagated to corresponding timing units; and resulting timing unit outputs are propagated to corresponding 4-level decoders.

"10" Data DAT 1444 changes state 1446, outputting decoded binary data 422, after "10" Data Dout 1404 changes state 1448; CLK0 1408 changes state 1410; CLK1 1416 changes state 1418; CLK2 1424 changes state 1426; state changes 1410, 1418, 1424, 1448 are propagated to corresponding timing units; and resulting timing unit outputs are propagated to corresponding 4-level decoders.

"11" Data DAT 1450 changes state 1452, outputting decoded binary data 422, after CLK0 1408 changes state 1410; CLK1 1416 changes state 1418; CLK2 1424 changes state 1426; state changes 1410, 1418, 1424 are propagated to corresponding timing units; and resulting timing unit outputs are propagated to corresponding 4-level decoders.

Once CLK2 1424 changes state 1426, it causes a Read Done 1454 to change state 1456, indicating that the PCM cell decoding is complete. Total read time can be shortened by not waiting for "11" Data Dout 1406 to change state 1458 before outputting Read Done 1456.

Figure 5:
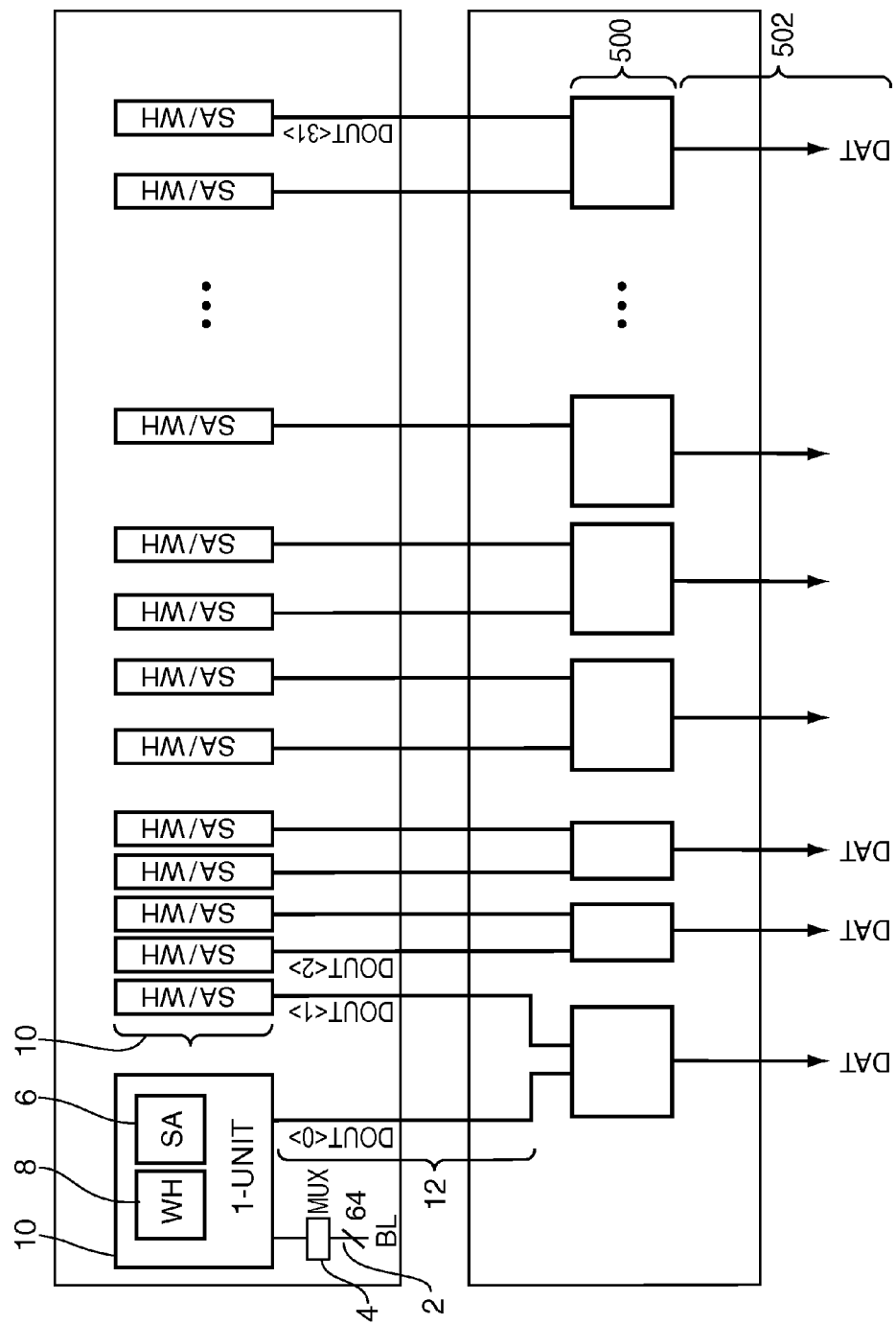
FIG. 5 schematically shows an example of a PCM memory.

FIG. 5 shows an example of a single-bit (2-level) PCM time-based differential decoding configuration. Pairs of sense amplifier outputs 12 received by individual LATCH units 500 correspond to pairs of PCM data cells storing complementary pairs of logical states, i.e., one Set state and one Reset state per pair of PCM data cells. Individual LATCH units 500 output binary outputs 502 based on which of the corresponding complementary pair of sense amplifier outputs 12 transitions first at the LATCH unit 500.

Figure 6A:
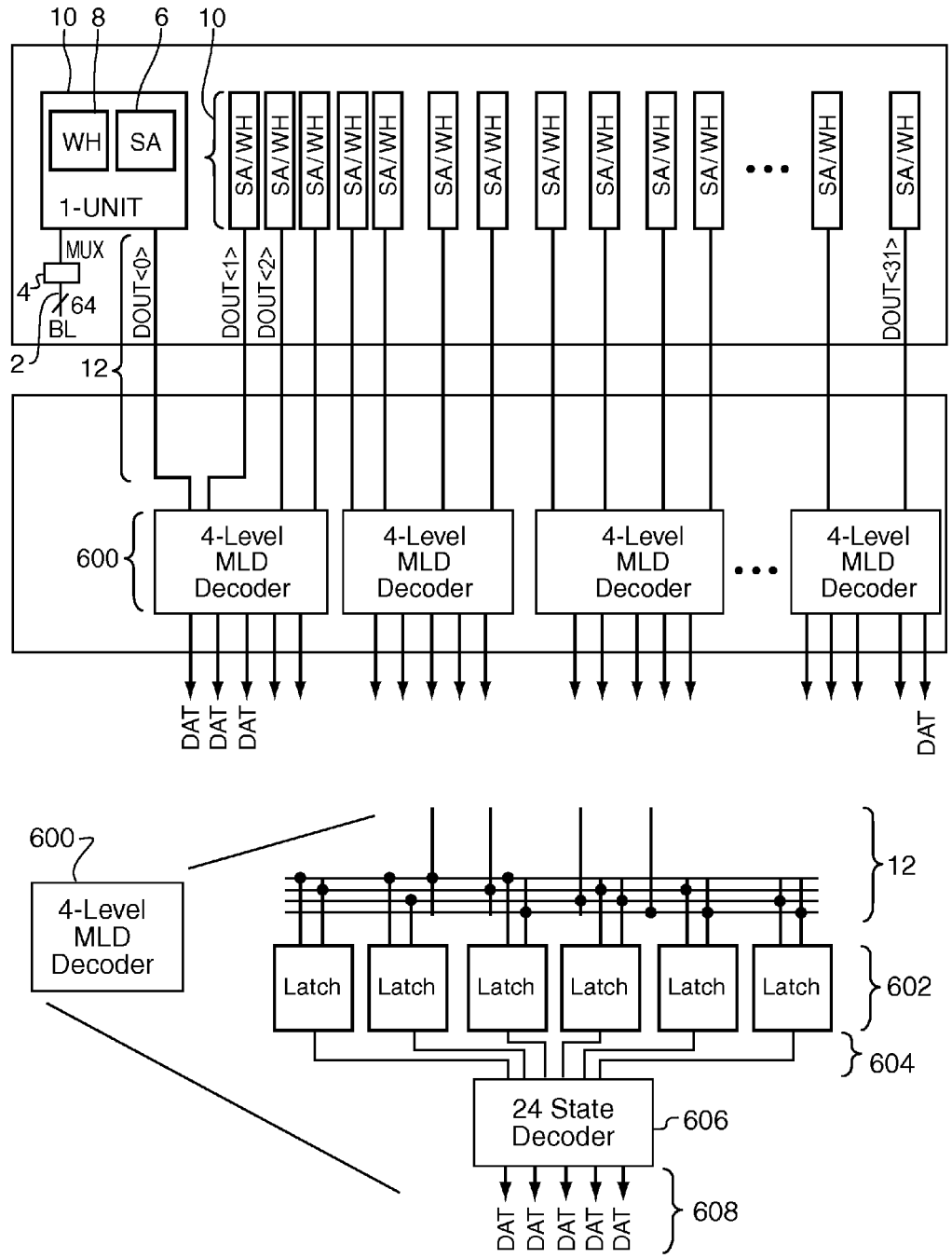
FIG. 6A schematically shows an example of a PCM memory.

FIG. 6A shows an example of a 4-level multibit PCM time-based differential decoding configuration. In some sample embodiments, 4-Level Decoders 600 receive groups of four sense amplifier outputs 12 corresponding to groups of four 4-level multibit PCM data cells. There are six possible pairs of the four sense amplifier outputs 12 corresponding to a group of cells. Within a 4-Level Decoder 600, the six possible pairs are received by six corresponding LATCH units 602, resulting in 24 (4!) possible collective states for the six LATCH unit outputs 604 (corresponding to the 24 possible collective states for the group of cells). A LATCH unit output 604 is determined by which of a pair of sense amplifier outputs 12 received by the LATCH unit 602 transitions at the LATCH unit 602 first.

The six LATCH unit outputs 604 are decoded by a 24-State Decoder 606. The 24-State Decoder 606 generates, and the 4-Level Decoder 600 outputs, resulting binary data outputs 608 corresponding to the collective states encoded by four-cell groups of 4-level PCM data cells.

Figure 6B:
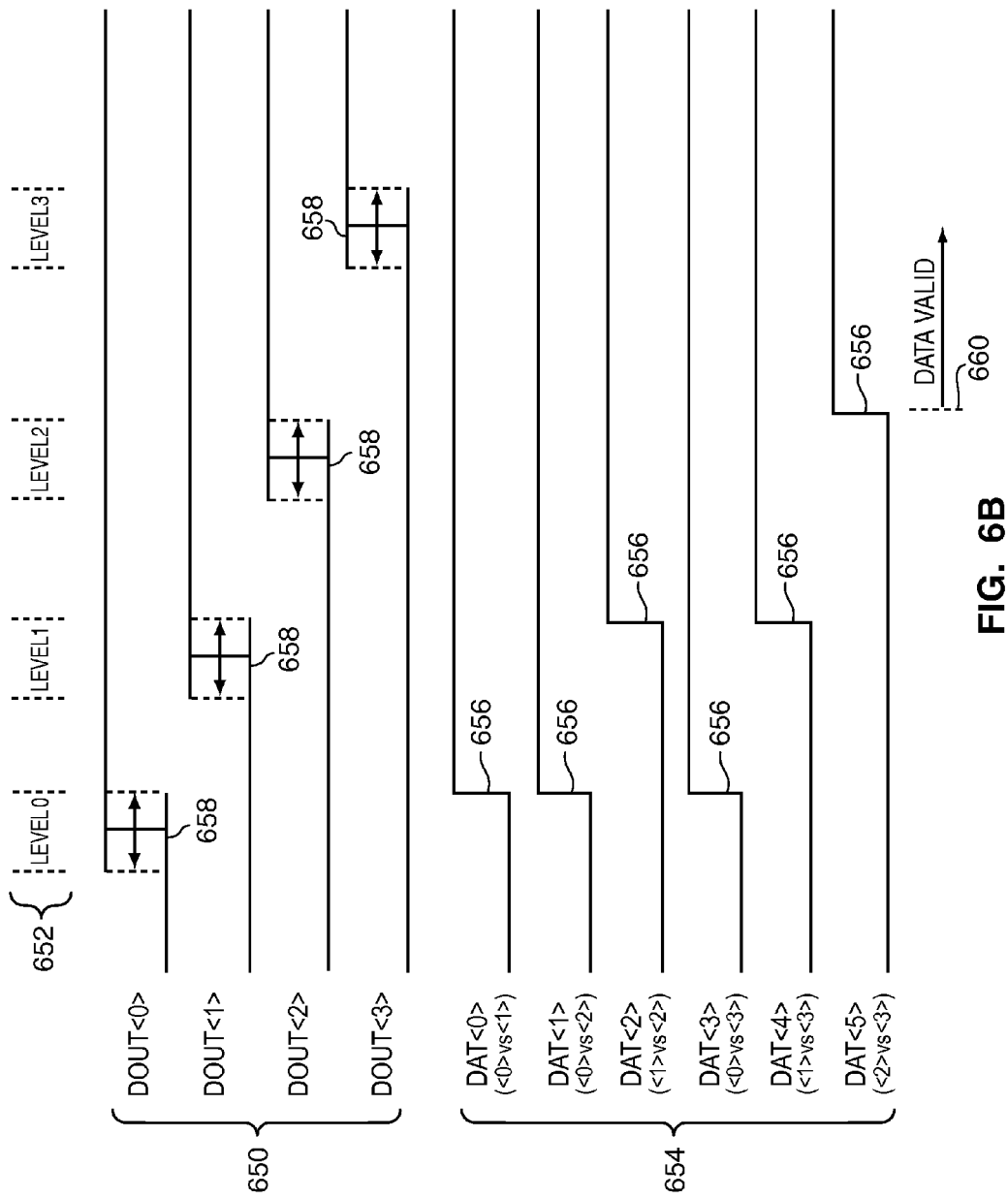
FIG. 6B shows an example of a timing diagram for PCM memory reads.

FIG. 6B shows an example of a timing diagram for 4-level multibit PCM time-based differential decoding. Each sense amplifier output 12 DOUT 650 in a four-cell group of 4-level multibit PCM stores a different resistance level corresponding to a different logical state 652. Six timing units compare each different pair of DOUT 650. A timing unit output 654 changes state 656 depending on which of a pair of data cells, corresponding to the pair of DOUT 650 received by the timing unit, has the lower resistance—i.e., which of the pair of DOUT 650 received by the timing unit changes state 658 and transitions at the timing unit first. Once the six timing units have changed state 656, the sensing process is complete and a valid data signal is outputted 660.

The six timing units will change state 656 once three of the DOUT 650 in a corresponding four-cell group have changed state 658. Not having to wait for the fourth cell to change state 658 allows embodiments corresponding to FIG. 6B to realize read cycle speed gains.

Figure 7:
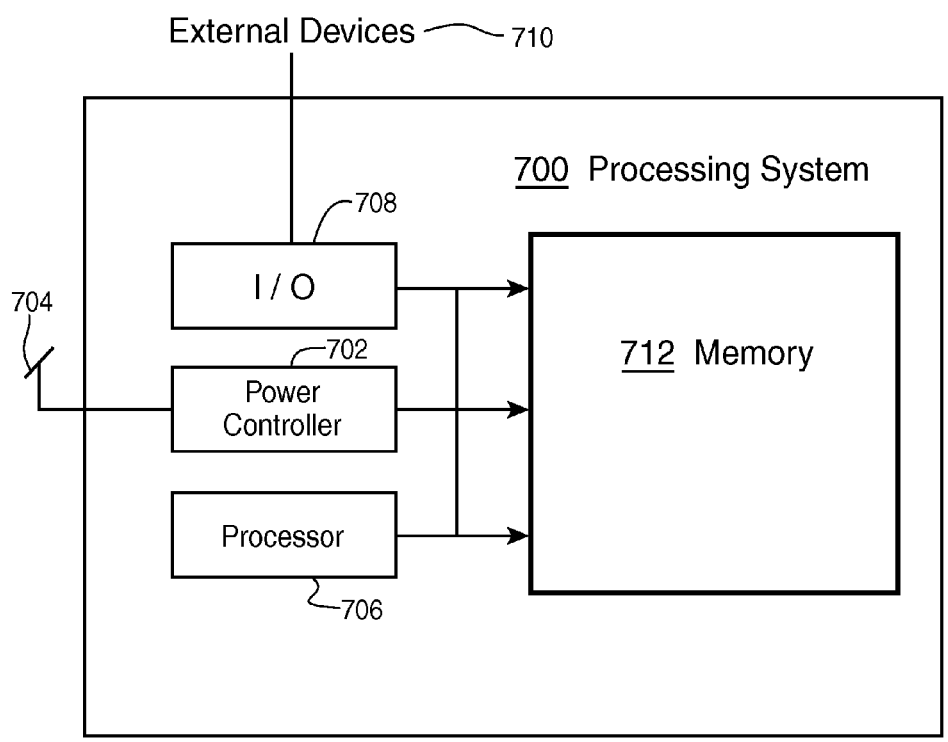
FIG. 7 shows an example of a processing system.

FIG. 7 shows an example of a processing system 700. Power control 702 manages distribution of power from a power source 704 to other components of the processing system. A processing unit 706 (e.g., a processor) performs processing functions, and an I/O control 708 (input/output) operates and manages communications with, and enables other processing system components 702, 706, 708, 712 to operate and manage communications with, external devices 710 and other external elements. The power control 702, processing unit 706 and I/O control 708 can also make memory access calls to a memory 712. Memory 712 can be a PCM memory, and/or can contain an embedded PCM memory. Processing system components 702, 706, 708, 712 perform their functions based on configuration data stored by nonvolatile PCM memory integrated into respective processing system components 702, 706, 708, 712.

According to some but not necessarily all embodiments, there is provided: A method of operating a phase-change memory, comprising: precharging data and reference bitlines, and accessing respective phase-change memory cells which shunt corresponding ones of said data bitlines, while a reference cell shunts said reference bitline; using respective sense amplifiers for said bitlines, each outputting a logic transition when the corresponding bitline reaches a sense threshold voltage; wherein said reference bitline always reaches said sense threshold voltage more slowly than data bitlines where said memory cells are in the lowest-resistance one of their possible data-dependent states; multiple sense amplifiers, each connected to at least a respective one of said bitlines, and each configured to output a logic transition when the voltage of the bitline passes a fixed threshold voltage; and latching circuits, jointly clocked by the output of a sense amplifier connected to said reference bitline, and which are respectively connected to receive and latch respective outputs of said sense amplifiers; whereby sensing occurs without requiring said sense amplifiers to reach a stable state.

According to some but not necessarily all embodiments, there is provided: A phase-change memory, comprising: multiple phase-change memory cells, each having a higher or lower resistance; multiple data bitlines, each connected to be shunted by a selected one of said data cells, and at least one reference bitline, connected to be shunted by a reference cell; wherein said reference cell discharges said reference bitline with a time constant which is slower than the time constant of said lower resistance in discharging said data bitlines; multiple sense amplifiers, each connected to at least a respective one of said bitlines, and each configured to output a logic transition when the voltage of the bitline passes a fixed threshold voltage; and latching circuits operatively connected to receive respective outputs of said sense amplifiers; wherein a respective one of said sense amplifiers is connected to said reference bitline, and provides an output which is connected to activate said latching circuits; whereby sensing occurs without requiring said sense amplifiers to reach a stable state.

According to some but not necessarily all embodiments, there is provided: A phase-change memory, comprising: multiple phase-change memory cells, each having either a higher-resistance state or a lower-resistance state, depending on what data has been saved into the phase-change memory cells; multiple data bitlines, each connected to be shunted by a selected one of said cells, and at least one reference bitline, connected to be shunted by a reference cell; wherein the ratio of current passed by said reference cell to the capacitance of said reference bitline is smaller than the ratio of current passed by ones of said cells which are in said lower-resistance state to the capacitance of said data bitline; precharge circuitry which applies a precharge voltage to some or all of said bitlines; multiple sense amplifiers, each connected to at least a respective one of said bitlines, and each configured to output a logic transition when the voltage of the bitline passes a fixed threshold voltage; and latching circuits operatively connected to receive respective outputs of said sense amplifiers; wherein a respective one of said sense amplifiers is connected to said reference bitline, and provides an output which is connected to activate said latching circuits; whereby sensing occurs without requiring said sense amplifiers to reach a stable state.

According to some but not necessarily all embodiments, there is provided: a memory, comprising: multiple groups of phase change memory cells, ones of said groups comprising multiple phase change memory storage cells and multiple phase change memory reference cells storing one or more references, and configured such that said storage cells and said reference cells in ones of said groups are read together; multiple sense amplifiers, ones of said sense amplifiers configured to sense read outputs of corresponding ones of said storage cells and said reference cells when one of said groups is read, and to produce sense amplifier outputs at times at least partially dependent on the states stored by said corresponding storage cells and reference cells; one or more vote units, ones of said vote units configured to generate a clock signal when a majority of said sense amplifier outputs corresponding to one of said references are detected to have transitioned at said vote unit; and multiple output units, ones of said output units configured to output a different binary value depending on whether one of said clock signals or one of said sense amplifier outputs corresponding to one of said storage cells changes state first at said output unit.

According to some but not necessarily all embodiments, there is provided: a memory, comprising: multiple groups of phase change memory cells, ones of said groups comprising multiple phase change memory storage cells and multiple phase change memory reference cells storing one or more references, and configured such that said storage cells and said reference cells in ones of said groups are read together; multiple sense amplifiers, ones of said sense amplifiers configured to sense read outputs of corresponding ones of said storage cells and said reference cells when one of said groups is read, and to produce sense amplifier outputs at times at least partially dependent on the states stored by said corresponding storage cells and reference cells; and multiple output units, ones of said output units configured to output a different binary value depending on whether a reference signal generated in at least partial dependence on one or more of said sense amplifier outputs corresponding to one of said references, or one of said sense amplifier outputs corresponding to one of said storage cells, first change state at said output unit.

According to some but not necessarily all embodiments, there is provided: a memory, comprising: multiple groups of phase change memory cells, ones of said groups comprising multiple groups of at least two phase change memory storage cells, said groups configured such that said storage cells in ones of said groups are read together, cells in ones of said groups of cells configured to store different logical states that are unique within said group of cells to define a collective state of said group of cells; multiple sense amplifiers, ones of said sense amplifiers configured to sense read outputs of corresponding ones of said storage cells when one of said groups is read, and to produce sense amplifier outputs at times at least partially dependent on the states stored by said corresponding storage cells; and multiple output units, ones of said output units configured to output a different binary value depending on which of a pair of said sense amplifier outputs corresponding to cells in one of said groups of cells first change state at said output unit.

According to some but not necessarily all embodiments, there is provided: a memory, comprising: multiple bitlines configured to read multiple selected ones of multiple phase change memory cells by precharging to approximately a precharge voltage and then discharging to a sense threshold voltage; multiple sense amplifiers configured to output when ones of said sense amplifiers detect that corresponding ones of said bitlines have discharged to said sense threshold voltage; one or more vote units, ones of said vote units configured to generate a clock signal on detection of transition at said vote unit of a majority of sense amplifier outputs corresponding to one of one or more references stored in multiple ones of said phase change memory cells; and multiple output units configured to output binary values depending on the order in which said clock signal, and a sense amplifier output corresponding to a phase change memory cell storing data, change state at corresponding ones of said output units.

According to some but not necessarily all embodiments, there is provided: a memory, comprising: multiple bitlines configured to read multiple selected ones of multiple phase change memory cells by precharging to approximately a precharge voltage and then discharging to a sense threshold voltage; multiple sense amplifiers configured to output when ones of said sense amplifiers detect that corresponding ones of said bitlines have discharged to said sense threshold voltage; and multiple output units configured to output binary values depending on the order in which sense amplifier outputs change state at corresponding ones of said output units.

According to some but not necessarily all embodiments, there is provided: a method of operating a memory, comprising: precharging multiple bitlines configured to enable read access to multiple phase change memory cells, and read accessing said cells using said bitlines; discharging said bitlines when charged to approximately a precharge voltage; sending sense amplifier outputs to corresponding ones of multiple output units when ones of multiple sense amplifiers detect that corresponding ones of said bitlines have discharged to a sense threshold voltage; generating one or more clock signals when ones of one or more vote units detect transition at said vote unit of a majority of sense amplifier outputs corresponding to ones of one or more references stored in multiple ones of said phase change memory cells; and outputting binary values depending on the order in which said clock signal, and ones of said sense amplifier outputs corresponding to ones of said phase change memory cells storing data, change state at corresponding ones of said output units.

According to some but not necessarily all embodiments, there is provided: a method of operating a memory, comprising: precharging multiple bitlines configured to enable read access to multiple phase change memory cells, and read accessing said cells using said bitlines; discharging said bitlines when charged to approximately a precharge voltage; when ones of multiple sense amplifiers detect that corresponding ones of said bitlines have discharged to a sense threshold voltage, sending sense amplifier outputs to corresponding ones of multiple output units; and outputting binary values depending on the order in which two or more of said sense amplifier outputs change state at corresponding ones of said output units.

According to some but not necessarily all embodiments, there is provided: a method of operating a memory, comprising: reading together multiple phase change memory storage cells and multiple phase change memory reference cells storing one or more references; sensing read outputs of said storage cells and said reference cells using multiple corresponding sense amplifiers; generating sense amplifier outputs at times at least partially dependent on the states stored by said storage cells and said reference cells; generating one or more clock signals, ones of said clock signals being generated when a majority of said sense amplifier outputs corresponding to one of said references are detected to have transitioned at a corresponding one of one or more vote units; and outputting binary values, ones of said binary values depending on whether one of said clock signals or one of said sense amplifier outputs corresponding to one of said storage cells is first to change state at one of multiple output units.

According to some but not necessarily all embodiments, there is provided: a method of operating a memory, comprising: reading together multiple phase change memory storage cells and multiple phase change memory reference cells storing one or more references; sensing read outputs of said storage cells and said reference cells using multiple corresponding sense amplifiers; generating sense amplifier outputs at times at least partially dependent on the states stored by said storage cells and said reference cells; and outputting binary values, ones of said binary values depending on whether a reference signal generated in at least partial dependence on one or more of said sense amplifier outputs corresponding to one of said references, or one of said sense amplifier outputs corresponding to one of said storage cells, is first to change state at one of multiple output units.

According to some but not necessarily all embodiments, there is provided: a memory, comprising: reading together multiple groups of at least two phase change memory storage cells, cells in ones of said groups of cells configured to store different logical states that are unique within said group of cells to define a collective state of said group of cells; sensing read outputs of said storage cells using multiple corresponding sense amplifiers; generating sense amplifier outputs at times at least partially dependent on the states stored by said storage cells and said reference cells; and outputting binary values, ones of said binary values depending on which of a pair of said sense amplifier outputs corresponding to cells in one of said groups of cells first changes state at ones of multiple output units.

According to some but not necessarily all embodiments, there is provided: a processing system, comprising: one or more memory units, one or more processors which execute programmable instruction sequences, and one or more input/output units; a phase change memory unit; multiple groups of phase change memory cells within said phase change memory unit configured to store and output configuration data, ones of said groups comprising multiple phase change memory storage cells and multiple phase change memory reference cells storing one or more references, and configured such that said storage cells and said reference cells in ones of said groups are read together; multiple sense amplifiers, ones of said sense amplifiers configured to sense read outputs of corresponding ones of said storage cells and said reference cells when one of said groups is read, and to produce sense amplifier outputs at times at least partially dependent on the states stored by said corresponding storage cells and reference cells; one or more vote units, ones of said vote units configured to generate a clock signal when a majority of said sense amplifier outputs corresponding to one of said references are detected to have transitioned at said vote unit; and multiple output units, ones of said output units configured to output a different binary value depending on whether one of said clock signals or one of said sense amplifier outputs corresponding to one of said storage cells first changes state at said output unit; wherein said processor and/or said input/output unit are configured to operate external elements in accordance with said configuration data.

According to some but not necessarily all embodiments, there is provided: a processing system, comprising: one or more memory units, one or more processors which execute programmable instruction sequences, and one or more input/output units; a phase change memory unit; multiple groups of phase change memory cells within said phase change memory unit configured to store and output configuration data, ones of said groups comprising multiple phase change memory storage cells and multiple phase change memory reference cells storing one or more references, and configured such that said storage cells and said reference cells in ones of said groups are read together; multiple sense amplifiers, ones of said sense amplifiers configured to sense read outputs of corresponding ones of said storage cells and said reference cells when one of said groups is read, and to produce sense amplifier outputs at times at least partially dependent on the states stored by said corresponding storage cells and reference cells; and multiple output units, ones of said output units configured to output a different binary value depending on whether a reference signal generated in at least partial dependence on one or more of said sense amplifier outputs corresponding to one of said references, or one of said sense amplifier outputs corresponding to one of said storage cells, first changes state at said output unit; wherein said processor and/or said input/output unit are configured to operate external elements in accordance with said configuration data.

According to some but not necessarily all embodiments, there is provided: a processing system, comprising: one or more memory units, one or more processors which execute programmable instruction sequences, and one or more input/output units; a phase change memory unit; multiple groups of phase change memory cells within said phase change memory unit configured to store and output configuration data, ones of said groups comprising multiple groups of at least two phase change memory storage cells, said groups configured such that said storage cells in ones of said groups are read together, cells in ones of said groups of cells configured to store different logical states that are unique within said group of cells to define a collective state of said group of cells; multiple sense amplifiers, ones of said sense amplifiers configured to sense read outputs of corresponding ones of said storage cells when one of said groups is read, and to produce sense amplifier outputs at times at least partially dependent on the states stored by said corresponding storage cells; multiple output units, ones of said output units configured to output a different binary value depending on which of a pair of said sense amplifier outputs corresponding to cells in one of said groups of cells first changes state at said output unit; and wherein said processor and/or said input/output unit are configured to operate external elements in accordance with said configuration data.

According to some but not necessarily all embodiments, there is provided: a method of operating a processing system comprising a phase change memory unit, a processor which executes programmable instruction sequences, and an input/output unit, comprising: precharging multiple bitlines configured to enable read access to multiple phase change memory cells, and read accessing said cells using said bitlines, said phase change memory cells being configured to store configuration data; discharging said bitlines when charged to approximately a precharge voltage; sending sense amplifier outputs to corresponding ones of multiple output units when ones of multiple sense amplifiers detect that corresponding ones of said bitlines have discharged to a sense threshold voltage; generating a clock signal when ones of one or more vote units detect transition at said vote unit of a majority of sense amplifier outputs corresponding to ones of one or more references stored in multiple ones of said phase change memory cells; outputting binary values depending on the order in which said clock signal, and ones of said sense amplifier outputs corresponding to phase change memory cells storing data, first change state at corresponding ones of said output units; and operating external elements using said processor and/or said input/output unit in accordance with said configuration data.

According to some but not necessarily all embodiments, there is provided: a method of operating a processing system comprising a phase change memory unit, a processor which executes programmable instruction sequences, and an input/output unit, comprising: precharging multiple bitlines configured to enable read access to multiple phase change memory cells, and read accessing said cells using said bitlines, said phase change memory cells being configured to store configuration data; discharging said bitlines when charged to approximately a precharge voltage; when ones of multiple sense amplifiers detect that corresponding ones of said bitlines have discharged to a sense threshold voltage, sending sense amplifier outputs to corresponding ones of multiple output units; outputting binary values depending on the order in which two or more of said sense amplifier outputs change state at corresponding ones of said output units; and operating external elements using said processor and/or said input/output unit in accordance with said configuration data.

According to some but not necessarily all embodiments, there is provided: methods and systems for time-based cell decoding for PCM memory. Generally, the higher the PCM element resistance, the longer it takes for a read output to change state. PCM memory output is determined using differentiated timings of read outputs changing state, rather than differentiated values of read outputs. In some single-bit single-ended-sensing embodiments, a reference, with resistance between the resistances corresponding to a pair of adjacent logical states, is stored in multiple reference cells; a "vote" unit emits a clock signal when a majority of the reference cell read outputs transition at the vote unit. Timing units produce different binary outputs depending on whether a data read output or the clock signal changes state first at the timing unit. Time-based decoding provides advantages including improved temperature and drift resilience, improved state discrimination, improved reliability of multibit PCM, and fast and reliable sensing.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

In some contemplated embodiments, intermediate reference currents can be created by varying the capacitance of a reference bit line. In one contemplated embodiment, two reference bit lines in complementary states can be shorted together to create an intermediate reference current.

In some embodiments, it is preferable that capacitance be substantially the same on bitlines with read outputs being compared to the same signal(s) (e.g., clock signal(s)), e.g., in time-based single-ended sensing; or the same within groups of bitlines with read outputs being compared to each other, e.g., in time-based differential sensing.

In some embodiments, it is preferable that capacitance be substantially the same on most or all bitlines.

In some embodiments, bitlines with different circuit capacitances are sensed by sense amplifiers with different sense threshold voltages.

In some embodiments, sense amplifiers and write heads are instantiated in separate units.

In some embodiments, references are stored in more or fewer than three PCM cells.

In some embodiments, references are stored in a resistance trim.

In some embodiments, references are stored in PCM cells that are written contemporaneously with the PCM cells they are used to discriminate.

In some embodiments, Vote units receive more than three sense amplifier reference outputs.

In some embodiments, 3-to-1 Vote units use a different circuit architecture from that described hereinabove, e.g., a logical gate arrangement that does not use only NAND gates.

In some embodiments, logical states are numbered with the lowest-resistance state having the highest number; in some embodiments, logical states are numbered with the lowest-resistance state having the lowest number.

In some embodiments, Vote units output a clock signal in response to receiving other than a majority of corresponding sense amplifier reference outputs, while maintaining the condition of not outputting a clock signal on outlier timings (e.g., earliest and/or latest) of receipt of sense amplifier reference outputs.

In some embodiments, multiple PCM cells can be selected from a bitline to be read contemporaneously and/or in combination with each other.

In some embodiments, timing units do not latch a binary output until a clock signal transitions at the timing unit, at which time they latch different logical states depending on whether a sense amplifier output corresponding to a PCM data cell has already transitioned at the timing unit.

In some embodiments, sense amplifier outputs corresponding to multibit PCM cells are current-mirrored, and multiple timing units corresponding to a single data cell receive current-mirrored copies of a corresponding sense amplifier output.

In some embodiments, timing units can incorporate decoding functions to produce decoded binary data outputs.

In some embodiments, a Read Done signal can be delayed to allow time to propagate a clock signal that triggered the Read Done signal to corresponding timing units. In some embodiments, delay can also be added to, e.g., allow time for timing units to produce respective outputs.

In some embodiments, outputs of timing units can be decoded to output binary data corresponding to the logical states with which corresponding PCM data cells were written. In some embodiments, outputs of timing units can be decoded to output binary data as received by the PCM memory in one or more write requests that caused corresponding PCM data cells to be written.

In some embodiments, time-based single-ended sensing for multibit PCM can decode raw timing unit data (e.g., LATCH unit outputs) in-memory and/or on-chip, or can feed out the raw timing unit data to be decoded externally to the memory and/or the chip.

In some embodiments, references are chosen to discriminate logical states other than pairs of adjacent logical states.

In some embodiments, a minority of stored instances of a reference can be replaced with a different value, e.g., data.

In some embodiments, test modes or other control functions can be used to switch a PCM memory between time-based single-ended decoding and time-based differential decoding.

In some embodiments, test modes or other control functions can be used to switch a PCM memory between single bit and multibit operation.

Memory timing disclosed herein is described with respect to particular edge-triggered state change behavior; in some embodiments, different edge-triggered, level-triggered or other state change behavior can be used.

In some embodiments, timing units latch on transition of a sense amplifier output other than the first to transition.

In some embodiments, timing units are configured to compare time of transition of more than two sense amplifier outputs.

Additional general background, which helps to show variations and implementations, may be found in the following publications, all of which are hereby incorporated by reference: Lam, Chung. "Phase Change Memory: A Replacement or Transformational Memory Technology," IEEE Workshop on Microelectronics and Electron Devices (WMED), c. 2011. Choi, Youngdon, et al. "A 20 nm 1.8V 8 Gb PRAM with 40 MB/s Program Bandwidth." ISSCC 2012/Session 2/High Bandwidth DRAM & PRAM/2.5. c. 2012.

Additional general background, which helps to show variations and implementations, as well as some features which can be synergistically with the inventions claimed below, may be found in the following US patent applications. All of these applications have at least some common ownership, copendency, and inventorship with the present application, and all of them are hereby incorporated by reference: U.S. patent application Ser. No. 13/869,108, "Cell-Generated Reference in Phase Change Memory"; and U.S. patent application Ser. No. 13/869,338, "Multilevel Differential Sensing in Phase Change Memory".

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A processing system, comprising:
   one or more memory units, one or more processors which execute programmable instruction sequences, and one or more input/output units;
   a phase change memory unit;
   multiple groups of phase change memory cells within said phase change memory unit configured to store and output configuration data, ones of said groups comprising multiple phase change memory storage cells and multiple phase change memory reference cells storing one or more references, and configured such that said storage cells and said reference cells in ones of said groups are read together;
   multiple sense amplifiers, ones of said sense amplifiers configured to sense read outputs of corresponding ones of said storage cells and said reference cells when one of said groups is read, and to produce sense amplifier outputs at times at least partially dependent on the states stored by said corresponding storage cells and reference cells;
   one or more vote units, ones of said vote units configured to generate a clock signal when a majority of said sense amplifier outputs corresponding to one of said references are detected to have transitioned at said vote unit; and
   multiple output units, ones of said output units configured to output a different binary value depending on whether one of said clock signals or one of said sense amplifier outputs corresponding to one of said storage cells first changes state at said output unit;
   wherein said processor and/or said input/output unit are configured to operate external elements in accordance with said configuration data.

2. The processing system of claim 1, wherein ones of said references are stored by phase change memory reference cells with resistance between the resistances of phase change memory storage cells storing corresponding pairs of adjacent logical states discriminated by said reference, and wherein different ones of said references discriminate different pairs of adjacent logical states.

3. The processing system of claim 1, further comprising one or more decode units which decode said binary values to generate binary outputs corresponding either to logical states with which corresponding ones of said phase change memory cells were written, or to data contained in one or more write instructions which caused corresponding ones of said phase change memory cells to be written.

4. The processing system of claim 1, further comprising:
   multiple bitlines, ones of said bitlines being configured to access corresponding ones of said cells in ones of said groups of cells for reads, such that when one of said groups is read, corresponding ones of said bitlines are configured to be precharged to approximately a precharge voltage and then discharged to a sense threshold voltage;
   wherein ones of said sense amplifiers are configured to produce said sense amplifier outputs when corresponding ones of said bitlines are discharged to said sense threshold voltage.

5. The processing system of claim 1, wherein said phase change memory cells are single bit phase change memory cells.

6. The processing system of claim 1, wherein different ones of said vote units receive sense amplifier outputs corresponding to different ones of said references.

7. The processing system of claim 1, wherein multiple ones of said output units correspond to ones of said sense amplifier outputs, and wherein different ones of said clock signals are configured to be received by different ones of said multiple output units corresponding to ones of said sense amplifier outputs.

8. A processing system, comprising:
one or more memory units, one or more processors which execute programmable instruction sequences, and one or more input/output units;
a phase change memory unit;
multiple groups of phase change memory cells within said phase change memory unit configured to store and output configuration data, ones of said groups comprising multiple phase change memory storage cells and multiple phase change memory reference cells storing one or more references, and configured such that said storage cells and said reference cells in ones of said groups are read together;
multiple sense amplifiers, ones of said sense amplifiers configured to sense read outputs of corresponding ones of said storage cells and said reference cells when one of said groups is read, and to produce sense amplifier outputs at times at least partially dependent on the states stored by said corresponding storage cells and reference cells; and
multiple output units, ones of said output units configured to output a different binary value depending on whether a reference signal generated in at least partial dependence on one or more of said sense amplifier outputs corresponding to one of said references, or one of said sense amplifier outputs corresponding to one of said storage cells, first changes state at said output unit;
wherein said processor and/or said input/output unit are configured to operate external elements in accordance with said configuration data.

9. The processing system of claim 8, wherein multiple bitlines are used to read cells in a group of cells being read, and wherein capacitance is substantially the same on said bitlines.

10. The processing system of claim 8, wherein ones of said references are stored by phase change memory cells with resistance between the resistances of phase change memory cells storing corresponding pairs of adjacent logical states discriminated by said reference.

11. The processing system of claim 8, further comprising one or more decode units which decode said binary values to generate binary outputs corresponding either to logical states with which corresponding ones of said phase change memory cells were written, or to data contained in one or more write instructions which caused corresponding ones of said phase change memory cells to be written.

12. The processing system of claim 8, further comprising:
multiple bitlines, ones of said bitlines being configured to access corresponding ones of said cells in ones of said groups of cells for reads, such that when one of said groups is read, corresponding ones of said bitlines are configured to be precharged to approximately a precharge voltage and then discharged to a sense threshold voltage;
wherein ones of said sense amplifiers are configured to produce said sense amplifier outputs when corresponding ones of said bitlines are discharged to said sense threshold voltage.

13. The processing system of claim 8, wherein said phase change memory cells are single bit phase change memory cells.

14. The processing system of claim 8, wherein multiple ones of said output units correspond to ones of said sense amplifier outputs, and wherein different ones of said reference signals are configured to be received by different ones of said multiple output units corresponding to ones of said sense amplifier outputs.

15. A processing system, comprising:
one or more memory units, one or more processors which execute programmable instruction sequences, and one or more input/output units;
a phase change memory unit;
multiple groups of phase change memory cells within said phase change memory unit configured to store and output configuration data, ones of said groups comprising multiple groups of at least two phase change memory storage cells, said groups configured such that said storage cells in ones of said groups are read together, cells in ones of said groups of cells configured to store different logical states that are unique within said group of cells to define a collective state of said group of cells;
multiple sense amplifiers, ones of said sense amplifiers configured to sense read outputs of corresponding ones of said storage cells when one of said groups is read, and to produce sense amplifier outputs at times at least partially dependent on the states stored by said corresponding storage cells;
multiple output units, ones of said output units configured to output a different binary value depending on which of a pair of said sense amplifier outputs corresponding to cells in one of said groups of cells first changes state at said output unit; and
wherein said processor and/or said input/output unit are configured to operate external elements in accordance with said configuration data.

16. The processing system of claim 15, wherein multiple bitlines are used to read cells in a group of cells being read, and wherein capacitance is substantially the same on said bitlines.

17. The processing system of claim 15, further comprising multiple decode units, wherein each possible pair of sense amplifier outputs corresponding to ones of said groups is compared by corresponding output units, and wherein said decode units decode output unit outputs to provide binary data outputs corresponding to said collective states of corresponding ones of said groups.

18. The processing system of claim 15, further comprising:
multiple bitlines, ones of said bitlines being configured to access corresponding ones of said cells in ones of said groups of cells for reads, such that when one of said groups is read, corresponding ones of said bitlines are configured to be precharged to approximately a precharge voltage and then discharged to a sense threshold voltage;
wherein ones of said sense amplifiers are configured to produce said sense amplifier outputs when corresponding ones of said bitlines are discharged to said sense threshold voltage.

19. The processing system of claim 15, wherein said phase change memory cells are single bit phase change memory cells.

20. The processing system of claim 15, wherein said binary values are decoded externally to the memory.

* * * * *